United States Patent
Lee et al.

(10) Patent No.: US 12,457,875 B2
(45) Date of Patent: Oct. 28, 2025

(54) DISPLAY DEVICE INCLUDING QUANTUM DOT LAYER

(71) Applicant: Samsung Display Co., Ltd., Yongin-si (KR)

(72) Inventors: Seon Uk Lee, Seongnam-si (KR); Kanguk Kim, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 289 days.

(21) Appl. No.: 17/800,448

(22) PCT Filed: Oct. 12, 2020

(86) PCT No.: PCT/KR2020/013837
§ 371 (c)(1),
(2) Date: Aug. 17, 2022

(87) PCT Pub. No.: WO2021/246582
PCT Pub. Date: Dec. 9, 2021

(65) Prior Publication Data
US 2023/0099599 A1    Mar. 30, 2023

(30) Foreign Application Priority Data

Jun. 4, 2020  (KR) .................. 10-2020-0067785

(51) Int. Cl.
*H10K 59/38* (2023.01)
*H10K 59/40* (2023.01)
*H10K 59/80* (2023.01)

(52) U.S. Cl.
CPC ............ *H10K 59/38* (2023.02); *H10K 59/40* (2023.02); *H10K 59/8792* (2023.02)

(58) Field of Classification Search
None
See application file for complete search history.

(56) References Cited

U.S. PATENT DOCUMENTS

| 8,514,211 B2 | 8/2013 | Choi et al. |
| 8,692,817 B2 | 4/2014 | Hong |
| 9,034,674 B2 | 5/2015 | Speier et al. |

(Continued)

FOREIGN PATENT DOCUMENTS

| CN | 107533167 | 1/2018 |
| CN | 109904190 | 6/2019 |

(Continued)

OTHER PUBLICATIONS

International Search Report, with English translation, corresponding to International Application No. PCT/KR2020/013837 dated Mar. 3, 2021.

(Continued)

*Primary Examiner* — Nduka E Ojeh
(74) *Attorney, Agent, or Firm* — CANTOR COLBURN LLP

(57) ABSTRACT

A display device includes a display panel and a first quantum dot layer disposed on the display panel, wherein the first quantum dot layer includes a first portion and a second portion extending from a side of the first portion in a first direction. The second portion has a width less than a width of the first portion in a second direction intersecting the first direction.

21 Claims, 28 Drawing Sheets

(56) References Cited

U.S. PATENT DOCUMENTS

| | | | |
|---|---|---|---|
| 10,475,857 B2 * | 11/2019 | Song | H10K 50/805 |
| 10,539,826 B2 | 1/2020 | Lee et al. | |
| 10,705,271 B2 | 7/2020 | Kim et al. | |
| 10,725,333 B2 | 7/2020 | Kim et al. | |
| 10,768,470 B2 | 9/2020 | Park et al. | |
| 10,859,873 B2 | 12/2020 | Kang et al. | |
| 11,016,328 B2 | 5/2021 | Kim et al. | |
| 11,016,331 B2 | 5/2021 | Lee et al. | |
| 11,139,348 B2 | 10/2021 | Kim et al. | |
| 2008/0036367 A1 | 2/2008 | Eida et al. | |
| 2008/0124997 A1 * | 5/2008 | Park | G02F 1/133514 445/24 |
| 2018/0081096 A1 | 3/2018 | Claes | |
| 2019/0025634 A1 * | 1/2019 | Park | G02F 1/133377 |
| 2020/0041837 A1 * | 2/2020 | Jiang | G02F 1/133609 |
| 2022/0052296 A1 * | 2/2022 | Noh | H10K 50/818 |

FOREIGN PATENT DOCUMENTS

| | | |
|---|---|---|
| CN | 111223894 | 6/2020 |
| JP | 2016-194561 | 11/2016 |
| KR | 10-2007-0049172 | 5/2007 |
| KR | 10-2010-0039610 | 4/2010 |
| KR | 10-2011-0108049 | 10/2011 |
| KR | 10-2016-0017373 | 2/2016 |
| KR | 10-1685019 | 12/2016 |
| KR | 1020170086442 A | 7/2017 |
| KR | 10-2017-0127025 | 11/2017 |
| KR | 10-2018-0092326 | 8/2018 |
| KR | 10-2018-0112888 | 10/2018 |
| KR | 10-2019-0067955 | 6/2019 |
| KR | 10-2019-0115131 | 10/2019 |
| KR | 10-2020-0039059 | 4/2020 |
| KR | 10-2020-0059369 | 5/2020 |
| TW | 201316826 | 4/2013 |

OTHER PUBLICATIONS

Written Opinion, with English translation, corresponding to International Application No. PCT/KR2020/013837 dated Mar. 3, 2021.

* cited by examiner

DISPLAY DEVICE INCLUDING QUANTUM DOT LAYER

CROSS-REFERENCE TO RELATED APPLICATION(S)

This application is a national entry of International Application No. PCT/KR2020/013837, filed on Oct. 12, 2020, which claims under 35 U.S.C. §§ 119(a) and 365(b) priority to and benefits of Korean Patent Application No. 10-2020-0067785, filed on Jun. 4, 2020, in the Korean Intellectual Property Office (KIPO), the entire contents of which are incorporated herein by reference.

BACKGROUND

1. Technical Field

Embodiments relate to a display device.

2. Description of the Related Art

In general, a display device includes pixels for displaying an image. Each of the pixels includes an image display element disposed on a pixel area and a driving element disposed around the pixel area. The driving element drives the image display element, and the image display element generates light to display an image.

Recently, a display device including light conversion layers has been developed to improve color purity. The light conversion layers are disposed on the pixels to convert the light generated in the pixels into light having different wavelengths. Each of the light conversion layers overlaps a corresponding pixel of the pixels. Each of the light conversion layers includes quantum dots for converting a wavelength of light.

SUMMARY

Embodiments provide a display device capable of improving light conversion efficiency and reducing a time for manufacturing quantum dot layers.

In an embodiment, a display device may include a display panel and a first quantum dot layer disposed on the display panel, wherein the first quantum dot layer includes a first portion and a second portion extending from a side of the first portion in a first direction, wherein the second portion has a width less than a width of the first portion in a second direction intersecting the first direction.

The first portion may have a thickness greater than a thickness of the second portion in a third direction perpendicular to a plane defined by the first direction and the second direction.

The display device may further include a first barrier layer including a first opening, the first opening in which the first portion is disposed; and a second barrier layer disposed on the first barrier layer and including a second opening, the second opening in which the first portion and the second portion are disposed.

Each of the first barrier layer and the second barrier layer may have a black color.

The display panel may include: a first emission area; and a non-emission area around the first emission area. The first emission area may overlap the first portion, and the second portion may overlap the non-emission area.

The first portion may be configured to convert a first light generated in the first emission area into a second light.

The display device may further include: a second quantum dot layer disposed on the display panel; and a light transmitting layer disposed on the display panel, wherein the first quantum dot layer, the second quantum dot layer, and the light transmitting layer may be arranged in the second direction.

The second quantum dot layer may include: a third portion facing the second portion in the second direction; and a fourth portion extending from a side of the third portion in the first direction and facing the first portion in the second direction, and the fourth portion may have a width less than a width of the third portion in the second direction.

The third portion may have a thickness greater than a thickness of the fourth portion in a third direction perpendicular to a plane defined by the first direction and the second direction.

The display panel may include: a second emission area; and a non-emission area around the second emission area, the third portion may overlap the second emission area, and the fourth portion may overlap the non-emission area.

The third portion may be configured to convert a first light generated in the second emission area into a third light.

The light transmitting layer may include: a fifth portion extending in the first direction; and a sixth portion extending from a side of the fifth portion in the first direction, and the fifth portion may have a thickness greater than a thickness of the sixth portion in a third direction perpendicular to a plane defined by the first direction and the second direction.

The display panel may include: a third emission area; and a non-emission area around the third emission area, the fifth portion may overlap the third emission area, and the sixth portion may overlap the non-emission area.

The first quantum dot layer may further include a first sub portion disposed between the first portion and the second portion, the first sub portion may have a width less than the width of the first portion in the second direction, and a thickness of the first sub portion may be substantially equal to a thickness of the first portion in a third direction perpendicular to a plane defined by the first direction and the second direction.

The width of the first sub portion may be substantially equal to the width of the second portion, and the first sub portion may extend from the first portion in the second direction.

The width of the first sub portion may gradually decrease as being closer to the second portion from the first portion in the second direction.

The display device may further include: a first barrier layer including a first opening, the first portion and the first sub portion disposed in the first opening; and a second barrier layer disposed on the first barrier layer and including a second opening, the second opening in which the first portion, the second portion, and the first sub portion are disposed.

The display device may further include a second quantum dot layer having a rectangular shape, facing the first portion in the first direction, and facing the second portion in the second direction.

In an embodiment, a display device may include a display panel including an emission area and a non-emission area around the emission area and a first quantum dot layer disposed on the first emission area, wherein the first quantum dot layer includes a first portion and a second portion extending from a side of the first portion in a first direction, and the first portion has a thickness greater than a thickness of the second portion.

The display device may further include: a first barrier layer including a first opening, the first opening in which the first portion is disposed; and a second barrier layer disposed under the first barrier layer and including a second opening, the second opening in which the first portion and the second portion are disposed.

According to the embodiment, each of the first and second quantum dot layers may have the "L" shape to improve the light conversion efficiency and reduce the time for manufacturing the first and second quantum dot layers.

DETAILED DESCRIPTION OF THE EMBODIMENTS

Figure 1:
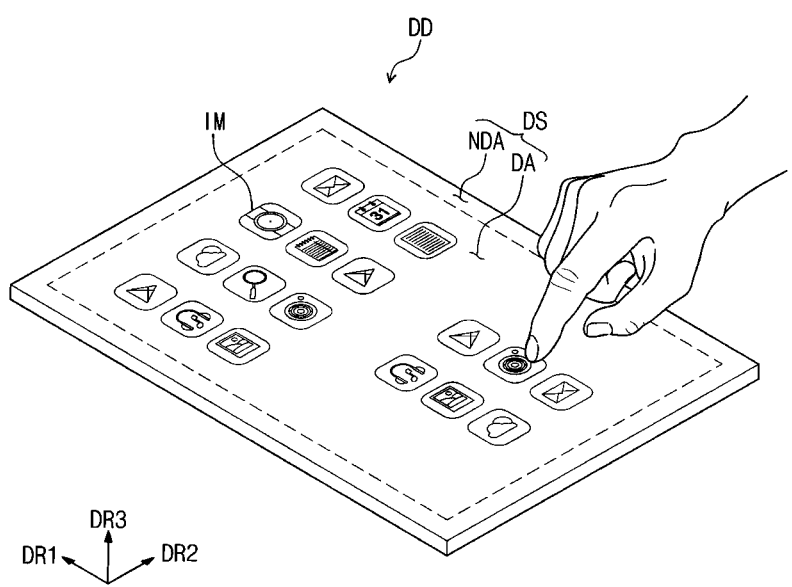
FIG. 1 is a schematic perspective view of a display device according to an embodiment.

In this specification, it will also be understood that when one component (or area, layer, portion) is referred to as being "on", "connected to", or "coupled to" another component, it can be directly disposed/connected/coupled on/to the one component, or an intervening third component may also be present.

Like reference numerals refer to like elements throughout. Also, in the figures, the thickness, ratio, and dimensions of components are exaggerated for clarity of illustration.

The term "and/or" includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in an embodiment can be referred to as a second element in another embodiment without departing from the scope of the appended claims. The terms of a singular form may include plural forms unless referred to the contrary.

Also, "under", "below", "above", "upper", and the like are used for explaining relation association of components illustrated in the drawings. The terms may be a relative concept and described based on directions expressed in the drawings.

Unless otherwise defined, all terms (including technical and scientific terms) used herein have the same meaning as commonly understood by a person of ordinary skill in the art to which the invention belongs. Also, terms such as defined terms in commonly used dictionaries are to be interpreted as having meanings consistent with meaning in the context of the relevant art and are expressly defined herein unless interpreted in an ideal or overly formal sense.

The meaning of "include" or "comprise" specifies a property, a fixed number, a step, an operation, an element, a component or a combination thereof, but does not exclude other properties, fixed numbers, steps, operations, elements, components or combinations thereof.

Hereinafter, embodiments will be described in detail with reference to the accompanying drawings.

FIG. 1 is a schematic perspective view of a display device according to an embodiment.

Referring to FIG. 1, a display device DD according to an embodiment may have a rectangular shape having long sides extending in a first direction DR1 and short sides extending in a second direction DR2 intersecting the first direction DR1. However, embodiments are not limited thereto. For example, the display device DD may have various shapes such as a circular shape or a polygonal shape.

Hereinafter, a direction that substantially perpendicularly intersects a plane defined by the first direction DR1 and the second direction DR2 is defined as a third direction DR3. The term "viewed from the plane" may mean a state viewed from the third direction DR3.

A top surface of the display device DD may be defined as a display surface DS and have a plane defined by the first direction DR1 and the second direction DR2. Images IM generated from the display device DD may be provided to a user through the display surface DS.

The display surface DS may include a display area DA and a non-display area NDA around the display area DA. An image may be displayed on the display area DA, but may not be displayed on the non-display area NDA. The non-display area NDA may surround the display area DA and define an edge of the display device DD, which is printed with a color (e.g., a predetermined color).

The display device DD may be applied to large-sized electronic devices such as such as televisions, monitors, or external billboards. Also, the electronic device ED may be applied to small or medium-sized electronic devices such as personal computers, notebook computers, personal digital assistants, car navigation systems, game consoles, smart phones, tablet PCs, and cameras. However, the above-described devices are described as an example, and the display device DD may be adopted for other electronic devices unless departing from the spirit and scope of the invention.

Figure 2:
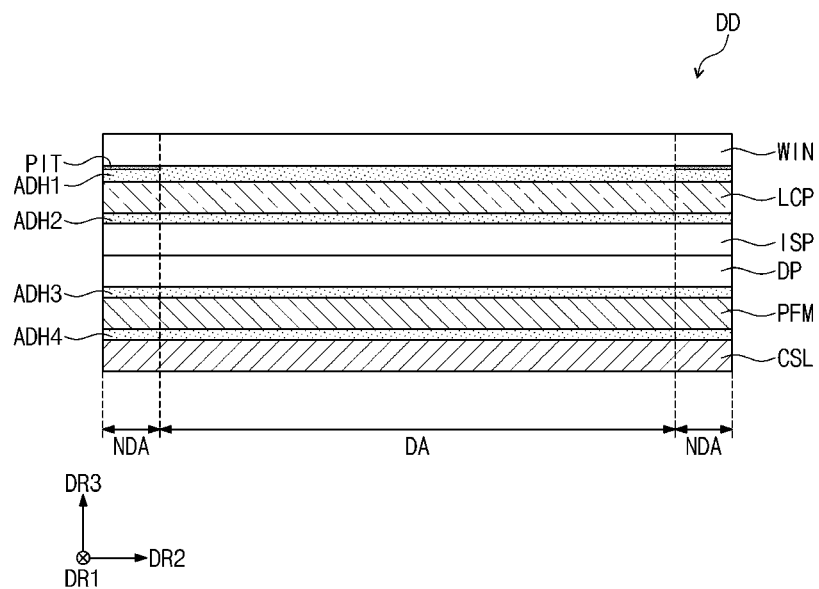
FIG. 2 is a schematic cross-sectional view illustrating an example of the display device illustrated in FIG. 1.

FIG. 2 is a schematic cross-sectional view illustrating the display device of FIG. 1.

Referring to FIG. 2, a display device DD may include a display panel DP, an input sensing part ISP, a light conversion part LCP, a window WIN, a printing layer PIT, a protective film PFM, a cushion layer CSL, and first, second, third, and fourth adhesives ADH1, ADH2, ADH3, and ADH4.

The display panel DP may include a display area DA and a non-display area NDA around the display area DA. The display panel DP may be a flexible display panel. For example, the display panel DP may include electronic elements disposed on a flexible substrate. The display panel DP may generate light for displaying an image. Light may be generated in the display area DA.

The display panel DP according to an embodiment may be an emission type display panel, but embodiments are not limited thereto. For example, the display panel DP may be an organic light emitting display panel or a quantum dot light emitting display panel. An emission layer of the organic light emitting display panel may include an organic light emitting material. An emission layer of the quantum dot light emitting display panel may include a quantum dot, a quantum rod, and the like. Hereinafter, the display panel DP is described as an organic light emitting display panel.

The input sensing part ISP may be disposed on the display panel DP. The input sensing part ISP may include sensing parts for sensing an external input. The sensing parts may sense the external input in a capacitive manner. The input sensing part ISP may be directly manufactured on the display panel DP when the display panel DP is manufactured. However, embodiments are not limited thereto, and the input sensing part ISP may be formed as a panel that is manufactured to be separated from the display panel DP and may be attached to the display panel DP by an adhesive. Also, in an embodiment, the input sensing part ISP may be omitted.

The light conversion part LCP may be disposed on the input sensing part ISP. The light conversion part LCP may receive the light generated by the display panel DP to convert a color of the received light. For example, the light conversion part LCP may reduce reflectance of external light. Hereinafter, the above-described constitutions will be described in detail.

The window WIN may be disposed on the light conversion part LCP. The window WIN may protect the display panel DP, the input sensing part ISP, and the light conversion part LCP from external scratches and impacts. An image generated in the display panel DP may pass through the window WIN and be provided to the user.

The protective film PFM may be disposed under the display panel DP. The protective film PFM may function as a protective substrate. The protective film PFM may protect a lower portion of the display panel DP. The protective film PFM may include a flexible plastic material. For example, the protective film PFM may include polyethylene terephthalate (PET).

The cushion layer CSL may be disposed under the protective film PFM. The cushion layer CSL may absorb an external impact applied to a lower portion of the display panel DP to protect the display panel DP. The cushion layer CSL may include a foam sheet having elasticity (e.g., predetermined elastic force).

The printing layer PIT may overlap (or cover) the non-display area NDA and be disposed on a bottom surface of the window WIN facing the display panel DP. The printing layer PIT may have a color, for example, a black color. The non-display area NDA may be printed with a color (e.g., a predetermined color) by the printing layer PIT.

The first adhesive ADH1 may be disposed between the window WIN and the light conversion part LCP. The window WIN and the light conversion part LCP may be bonded to each other by the first adhesive ADH1. The second adhesive ADH2 may be disposed between the light conversion part LCP and the input sensing part ISP. The light conversion part LCP and the input sensing part ISP may be bonded to each other by the second adhesive ADH2.

The third adhesive ADH3 may be disposed between the display panel DP and the protective film PFM. The display panel DP and the protective film PFM may be bonded to each other by the third adhesive ADH3. The fourth adhesive ADH4 may be disposed between the protective film PFM and the cushion layer CSL. The protective film PFM and the cushion layer CSL may be bonded to each other by the fourth adhesive ADH4.

The first adhesive ADH1 may include an optical clear adhesive. Each of the second, third, and fourth adhesives ADH2, ADH3, and ADH4 may include a pressure sensitive adhesive. The first adhesive ADH1 in the third direction DR3 may have a thickness greater than that of each of the second, third, and fourth adhesives ADH2, ADH3, and ADH4.

Figure 3:
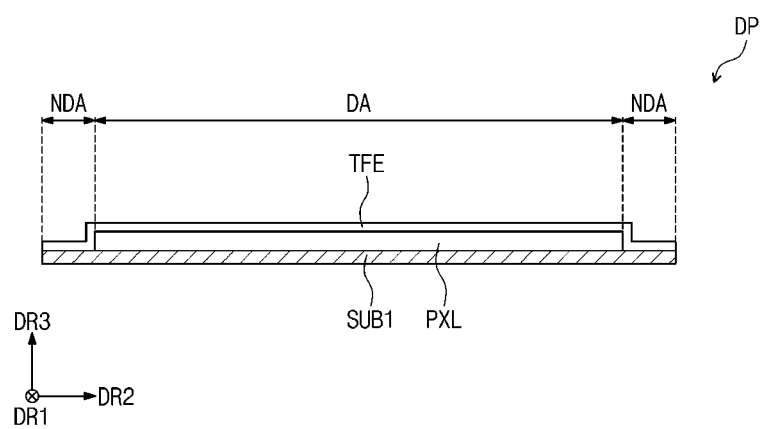
FIG. 3 is a schematic cross-sectional view illustrating an example of a display panel illustrated in FIG. 2.

FIG. 3 is a schematic cross-sectional view illustrating an example of the display panel illustrated in FIG. 2.

Referring to FIG. 3, the display panel DP may include a first substrate SUB1, a pixel layer PXL disposed on the first substrate SUB1, and a thin film encapsulation layer TFE disposed on the first substrate SUB1 to cover the pixel layer PXL.

The first substrate SUB1 may include a display area DA and a non-display area NDA around the display area DA. The first substrate SUB1 may include a flexible plastic material. For example, the first substrate SUB1 may include polyimide (PI).

The pixel layer PXL may be disposed on the display area DA of the first substrate SUB1. The pixel layer PXL may include pixels. Each of the pixels may include a transistor and a light emitting element connected to the transistor.

Figure 4:
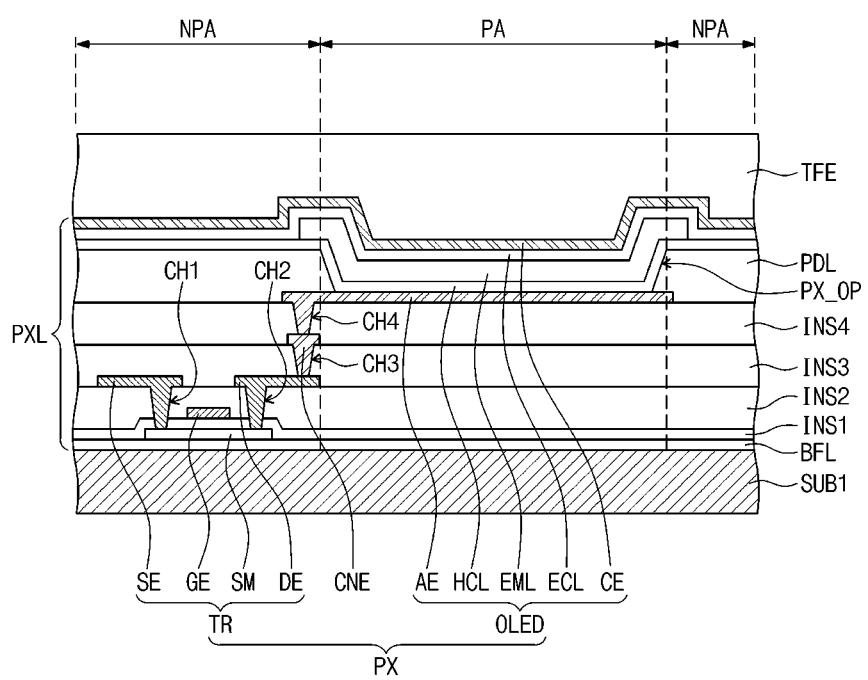
FIG. 4 is a schematic cross-sectional view illustrating an example of any one pixel disposed on a pixel layer illustrated in FIG. 3.

FIG. 4 is a schematic cross-sectional view illustrating an example of any one pixel disposed on a pixel layer illustrated in FIG. 3.

Referring to FIG. 4, the pixel PX may include the light emitting element OLED and the transistor TR connected to the light emitting element OLED. The light emitting element OLED may include a first electrode AE, a second electrode CE, a hole control layer HCL, an electron control layer ECL, and an emission layer EML.

The transistor TR and the light emitting element OLED may be disposed on the first substrate SUB1. The display area DA of the display panel DP may include an emission area PA corresponding to each of the pixels PX and a non-emission area NPA around the emission area PA. The light emitting element OLED may be disposed on the emission area PA, and the transistor TR may be disposed on the non-emission area NPA.

A buffer layer BFL may be disposed on the first substrate SUB1, and a semiconductor layer SM of the transistor TR may be disposed on the buffer layer BFL.

The semiconductor layer SM may include amorphous silicon, polycrystalline silicon, or an oxide semiconductor.

For example, the semiconductor layer SM may include a source region, a drain region, and a channel region between the source region and the drain region.

A first insulation layer INS1 may be disposed on the buffer layer BFL to cover the semiconductor layer SM. A gate electrode GE of the transistor TR overlapping (or facing) the semiconductor layer SM may be disposed on the first insulation layer INS1. The gate electrode GE may overlap a channel region of the semiconductor layer SM. A second insulation layer INS2 may be disposed on the first insulation layer INS1 to cover the gate electrode GE.

The source electrode SE and the drain electrode DE of the transistor TR may be spaced apart from each other on the second insulation layer INS2. The source electrode SE may be connected to the source region of the semiconductor layer SM through a first contact hole CH1 that is formed in each of the first and second insulation layers INS1 and INS2. The drain electrode DE may be connected to the drain region of the semiconductor layer SM through a second contact hole CH2 that is formed in each of the first and second insulation layers INS1 and INS2.

A third insulation layer INS3 may be disposed on the second insulation layer INS2 to cover the source and drain electrodes SE and DE of the transistor TR. A connection electrode CNE may be disposed on the third insulating layer INS3. The connection electrode CNE may be connected to the drain electrode DE through a third contact hole CH3 formed in the third insulating layer INS3.

A fourth insulating layer INS4 may be disposed on the third insulating layer INS3 to cover the connection electrode CNE. The first electrode AE may be disposed on the fourth insulating layer INS4. The first electrode AE may be connected to the connection electrode CNE through a fourth contact hole CH4 formed in the fourth insulating layer INS4.

A pixel defining layer PDL exposing a portion (e.g., a predetermined portion) of the first electrode AE may be disposed on the first electrode AE and the fourth insulating layer INS4. An opening PX OP through which a portion (e.g., a predetermined portion) of the first electrode AE is exposed may be formed in the pixel defining layer PDL.

The hole control layer HCL may be disposed on the first electrode AE and the pixel defining layer PDL. The hole control layer HCL may be commonly disposed on the emission area PA and the non-emission area NPA. The emission layer EML may be disposed on the hole control layer HCL. The emission layer EML may be disposed on an area corresponding to the opening PX OP. The emission layer EML may generate first light. For example, the first light may be blue light.

The electronic control layer ECL may be disposed on the hole control layer HCL to cover the emission layer EML. The electronic control layer ECL may be commonly disposed on the emission area PA and the non-emission area NPA. The second electrode CE may be disposed on the electronic control layer ECL.

The thin film encapsulation layer TFE may be disposed on the second electrode CE to cover the light emitting element OLED. The pixel layer between the first substrate SUB1 and the thin film encapsulation layer TFE may be defined as a pixel layer PXL. The thin film encapsulation layer TEF may include at least two inorganic layers and an organic layer disposed between the at least two inorganic layers. The inorganic layers may protect the pixel layer PXL from permeation of moisture/oxygen. The organic layer may protect the pixel layer PXL from foreign substances such as dust particles.

A first voltage may be applied to the first electrode AE, and a second voltage having a level lower than that of the first voltage may be applied to the second electrode CE. Holes and electrons injected into the emission layer EML may be coupled (or combined) to each other to form exciton. While the exciton may be transitioned to a ground state, the light emitting element OLED may emit light. The light emitting element OLED may emit light to display an image.

Figure 5:
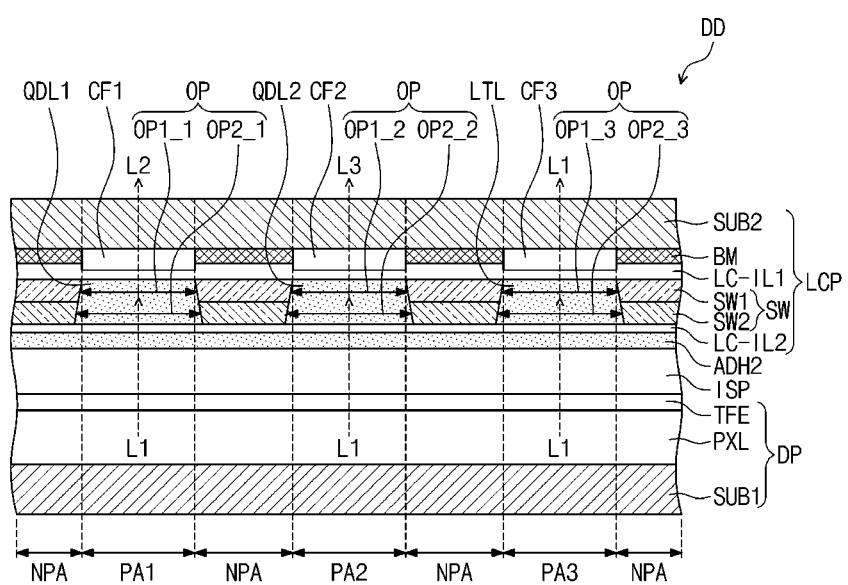
FIG. 5 is a schematic cross-sectional view illustrating an example of a portion of the display device, which corresponds to first, second, and third emission areas.

FIG. 5 is a schematic cross-sectional view illustrating an example of a portion of the display device, which corresponds to first, second, and third emission areas.

For convenience of description, in FIG. 5, the window WIN, the protective film PFM, and the cushion layer CSL are omitted. Also, the detailed configuration of the pixels PX is omitted, and the first, second, and third emission areas PA1, PA2, and PA3 of the display panel DP are illustrated.

Referring to FIG. 5, the display panel DP may include a first emission area PA1, a second emission area PA2, a third emission area PA3, and a non-emission area NPA disposed around each of the first, second, and third emission areas PA1, PA2, and PA3.

The emission area PA illustrated in FIG. 5 may be any one of the first, second, and third emission areas PA1, PA2, and PA3. The first, second, and third emission areas PA1, PA2, and PA3 may generate the first light L1. For example, the first light L1 may be blue light.

The light conversion part LCP may include a second substrate SUB2, first and second quantum dot layers QDL1 and QDL2, a light transmitting layer LTL, first, second, and third color filters CF1, CF2 and CF3, a black matrix BM, a barrier layer SW, and first and second insulating layers LC-IL1 and LC-IL2.

The first and second quantum dot layers QDL1 and QDL2, the light transmitting layer LTL, the first, second, and third color filters CF1, CF2, CF3, the black matrix BM, and the barrier layer SW may be disposed on a bottom surface of the second substrate SUB2 facing the display panel DP. The first and second quantum dot layers QDL1 and QDL2, the light transmitting layer LTL, the first, second, and third color filters CF1, CF2, CF3, the black matrix BM, and the barrier layer SW may be disposed between the display panel DP and the second substrate SUB2.

The first, second, and third color filters CF1, CF2, CF3 and the black matrix BM may be disposed under the second substrate SUB2. The first, second, and third color filters CF1, CF2, and CF3 are disposed on the first, second, and third emission areas PA1, PA2, and PA3 to overlap the first, second, and the third emission areas PA1, PA2, and PA3. The black matrix BM may overlap (or cover) the non-emission area NPA.

The first color filter CF1 may overlap (or cover) the first emission area PA1, the second color filter CF2 may overlap (or cover) the second emission area PA2, and the third color filter CF3 may overlap (or cover) the third emission area PA3. The first color filter CF1 may include a red color filter. The second color filter CF2 may include a green color filter. The third color filter CF3 may include a blue color filter. A first insulating layer LC-IL1 may be disposed under the first, second, and third color filters CF1, CF2, and CF3 and the black matrix BM.

Openings OP in which the first and second quantum dot layers QDL1 and QDL2 and the light transmitting layer LTL are disposed may be formed in the barrier layer SW. The openings OP may overlap (or cover) the first, second, and third emission areas PA1, PA2, and PA3. The barrier layer SW may include a first barrier layer SW1 and a second barrier layer SW2 disposed on the first barrier layer SW1.

The term "on" may be a relative concept and may mean being disposed on a top surface of a specific configuration or a bottom surface of a specific configuration. For example, the second barrier layer SW2 may be disposed on a bottom surface of the first barrier layer SW1.

The first barrier layer SW1 may be disposed under the first insulating layer LC-ILL First openings OP1_1, OP1_2, and OP1_3 overlapping the first, second, and third emission areas PA1, PA2, and PA3 may be formed in the first barrier layer SW1.

The second barrier layer SW2 may be disposed under the first barrier layer SW1. Second openings OP2_1, OP2_3, and OP2_3 overlapping the first, second, and third emission areas PA1_, PA2_, and PA3 may be formed in the second barrier layer SW2.

The first and second barrier layers SW1 and SW2 may overlap the non-emission area NPA. For example, each of the first and second barrier layers SW1 and SW2 may have a black color, but the color of each of the first and second barrier layers SW1 and SW2 is not limited thereto.

The first and second quantum dot layers QDL1 and QDL2 and the light transmitting layer LTL may be disposed under the first insulating layer LC-IL1. The first and second quantum dot layers QDL1 and QDL2 and the light transmitting layer LTL may be disposed in the first and second openings OP1 and OP2. A layer on which the first and second quantum dot layers QDL1 and QDL2 and the light transmitting layer LTL are disposed may function as a light conversion layer.

The first openings OP1_1, OP1_2, and OP1_3 may include a first sub opening OP1_1 in which the first quantum dot layer QDL1 is disposed, a second sub opening OP1_2 in which the second quantum dot layer QDL2 is disposed, and a third sub opening OP1_3 in which the light transmitting layer LTL is disposed. The second openings OP2_1, OP2_3, and OP2_3 may include a fourth sub opening OP2_1 in which the first quantum dot layer QDL1 is disposed, a fifth sub opening OP2_2 in which the second quantum dot layer QDL2 is disposed, and a sixth sub opening OP2_3 in which the light transmitting layer LTL is disposed.

The first and second quantum dot layers QDL1 and QDL2 and the light transmitting layer LTL may be disposed on the first, second, and third emission areas PA1_, PA2_, and PA3 to overlap (or cover) the first, second, and the third emission areas PA1_, PA2_, and PA3. For example, the first quantum dot layer QDL1 may overlap the first emission area PM. The second quantum dot layer QDL2 may overlap the second emission area PA2. The light transmitting layer LTL may overlap the third emission area PA3.

The first and fourth sub openings OP1_1 and OP2_1 may overlap (or cover) the first emission area PM. The second and fifth sub openings OP1_2 and OP2_2 may overlap (or cover) the second emission area PA2. The third and sixth sub openings OP1_3 and OP2_3 may overlap the third emission area PA3.

First light L1 generated in the first, second, and third emission areas PA1_, PA2 and PA3 may be provided (or transmitted) to the first and second quantum dot layers QDL1 and QDL2 and the light transmitting layer LTL. The first light L1 generated in the first emission area PA1 may be provided (or transmitted) to the first quantum dot layer QDL1, and the first light L1 generated in the second emission area PA2 may be provided (or transmitted) to the second quantum dot layer QDL2. The first light L1 generated in the third emission area PA3 may be provided (or transmitted) to the light transmitting layer LTL.

The first quantum dot layer QDL1 may convert the first light L1 into second light L2. The second quantum dot layer QDL2 may convert the first light L1 into third light L3. For example, the second light L2 may be red light, and the third light L3 may be green light. The first quantum dot layer QDL1 may include first quantum dots, and the second quantum dot layer QDL2 may include second quantum dots. The light transmitting layer LTL may include light scattering particles for scattering light.

The first quantum dots may convert the first light L1 having a blue wavelength band into the second light L2 having a red wavelength band. The second quantum dots may convert the first light L1 having the blue wavelength band into the third light L3 having a green wavelength band. The first and second quantum dots may scatter the second and third light L2 and L3. The light transmitting layer LTL may transmit (or pass) the first light L1 without performing a light conversion operation. The light transmitting layer LTL may scatter the first light L1 through light scattering particles to emit light. For example, the light scattering particles may be transmitted in at least one of the first and second quantum dot layers QDL1 and QDL2.

The first quantum dot layer QDL1 may emit the second light L2, the second quantum dot layer QDL2 may emit the third light L3, and the light transmitting layer LTL may emit the first light L1. For example, an image (e.g., a predetermined image) may be displayed by the second light L2, the third light L3, and the first light L1 displaying red, green, and blue colors.

A portion of the first light L1 may be transmitted to the first color filter CF1 by passing through the first quantum dot layer QDL1 without being light-converted by the first quantum dots. Since the first light L1 is not in contact with the first quantum dots, the first light L1 that is not converted into the second light L2 may exist. The first color filter CF1 may block light having different colors. The first light L1 that is not converted in the first quantum dot layer QDL1 may be blocked by the first color filter CF1 having the red color filter and thus may not be emitted upward (e.g., in the third direction DR3).

A portion of the first light L1 may be transmitted to the second color filter CF2 by passing through the second quantum dot layer QDL2 without being light-converted by the second quantum dots. Since the first light L1 is not in contact with the second quantum dots, the first light L1 that is not converted into the third light L3 may exist. The second color filter CF2 may block light having a different color. The first light L1 that is not converted in the second quantum dot layer QDL2 may be blocked by the second color filter CF2 having the green color filter and thus may not be emitted upward (e.g., in the third direction DR3).

External light may be transmitted from the display device DD toward the display panel DP. The external light may be white light. The white light may include red light, green light, and blue light. In case that the first, second, and third color filters CF1, CF2, and CF3 are not used, the external light may be reflected inside the display panel DP and provided to an external user. For example, the external light such as light reflected from a mirror may be viewed by the user.

The first, second, and third color filters CF1, CF2, and CF3 may prevent the external light from being reflected. For example, the first, second, and third color filters CF1, CF2, and CF3 may filter the external light into light having red, green, and blue colors.

For example, the green light and the blue light of the external light transmitted to the first color filter CF1 may be blocked by the first color filter CF1 including the red color filter. For example, the external light transmitted to the first color filter CF1 may be filtered by the first color filter CF1 as the same red light as the light emitted from the first quantum dot layer QDL1.

The red light and the blue light of the external light transmitted to the second color filter CF2 may be blocked by the second color filter CF2 that is the green color filter. For example, the external light transmitted to the second color filter CF2 may be filtered by the second color filter CF2 into the same green light as the light emitted from the second quantum dot layer QDL2.

The red light and the green light of the external light transmitted to the third color filter CF3 may be blocked by the third color filter CF3 that is the blue color filter. For example, the external light transmitted to the third color filter CF3 may be filtered by the third color filter CF3 into the same blue light as the light emitted from the light transmitting layer LTL. As a result, the reflection of the external light may be reduced.

The black matrix BM may block light in the non-emission area NPA. Each of the first and second barrier layers SW1 and SW2 having the black color may also have a function similar to that of the black matrix BM to block light in the non-emission area NPA.

For example, in order to prevent the reflection of the external light, the first, second, and third color filters CF1, CF2, and CF3 are used, but embodiments are not limited thereto. For example, the display device DD may include a polarizing film disposed on the display panel DP instead of the first, second, and third color filters CF1, CF2, and CF3 to prevent the reflection of the external light.

The polarizing film may function as an external light anti-reflection film. The polarizing film may reduce the reflectance of the external light incident toward the display panel from an upper side of the display device. For this operation, for example, the polarizing film may include a phase retarder and/or a polarizer.

Figure 6:
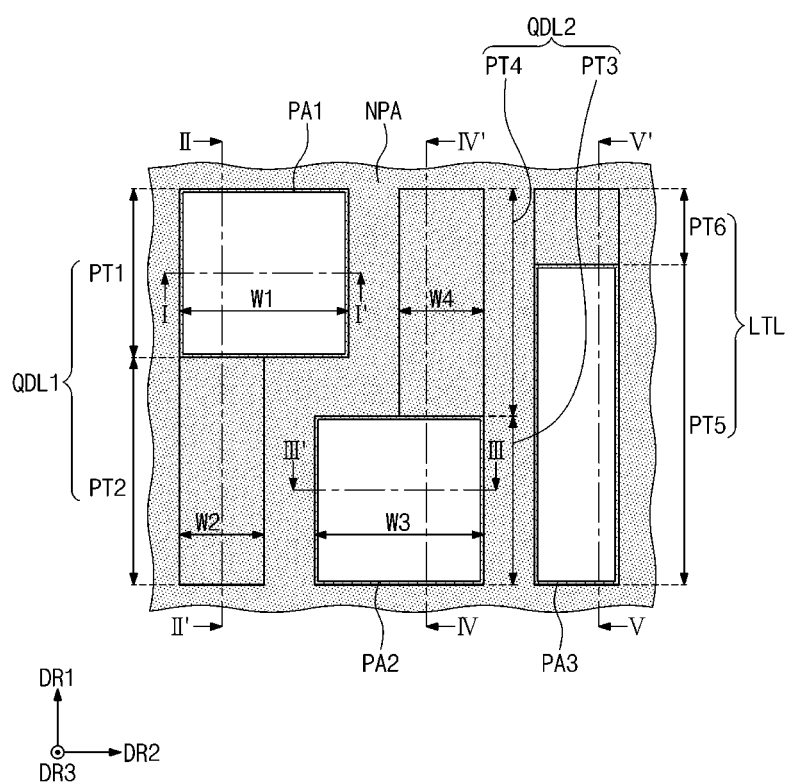
FIG. 6 is a schematic plan view illustrating the first, second, and third emission areas, first and second quantum dot layers, and a light transmitting layer, which are illustrated in FIG. 5.

FIG. 6 is a schematic plan view illustrating the first, second, and third emission areas, first and second quantum dot layers, and a light transmitting layer, which are illustrated in FIG. 5.

For example, in FIG. 6, the non-emission area NPA is marked with a gray color.

Referring to FIG. 6, the first and second quantum dot layers QDL1 and QDL2 and the light transmitting layer LTL may be arranged in the second direction DR2. When viewed in a plan view, the first emission area PA1 may have a surface area less than that of the first quantum dot layer QDL1. When viewed in a plan view, the second emission area PA2 may have a surface area less than that of the second quantum dot layer QDL2. When viewed in a plan view, the third emission area PA3 may have a surface area less than that of the light transmitting layer LTL.

Each of the first emission area PA1_, the second emission area PA2_, and the third emission area PA3 may have a rectangular shape, but the shapes of the first, second, and third emission areas PA1_, PA2_, and PA3 are not limited thereto. The third emission area PA3 may have a rectangular shape extending longer in the first direction DR1.

The first quantum dot layer QDL1 may include a first portion PT1 and a second portion PT2 extending from the first portion PT1. Each of the first portion PT1 and the second portion PT2 may have a rectangular shape, but the shapes of the first portion PT1 and the second portion PT2 are not limited thereto. For example, the second portion PT2 may have a rectangular shape extending longer in the first direction DR1.

The second portion PT2 may extend in the first direction DR1 from a side of the first portion PT1 of both sides of the first portion PT1 opposite to each other in the first direction DR1. A width W2 of the second portion PT2 in the second direction DR2 may be less than a width W1 of the first portion PT1. The first emission area PA1 may overlap (or cover) the first portion PT1. Although the first portion PT1 is illustrated to have the substantially same shape as the first emission area PA1_, embodiments are not limited thereto, and the first portion PT1 may have a different shape from that of the first emission area PA1. The second portion PT2 may overlap (or cover) the non-emission area NPA.

A side of the first portion PT1 extending in the first direction DR1 and a side of the second portion PT2 extending in the first direction DR1 may be disposed along a first line. According to this structure, the first quantum dot layer QDL1 may have a shape in which a shape "L" is vertically inverted. For example, a side of the first portion PT1 may indicate a left side of the first portion PT1, and a side of the second portion PT2 may indicate a left side of the second portion PT2.

The first light L1 generated in the first emission area PA1 may be transmitted to the first portion PT1. The first portion PT1 may convert the first light L1 transmitted from the first emission area PA1 into the second light L2. The second portion PT2 may not receive the first light L1. For example, the second portion PT2 may not perform the light conversion operation for converting the first light L1 into the second light L2.

The second quantum dot layer QDL2 may include a third portion PT3 and a fourth portion PT4 extending from the third portion PT3. Each of the third portion PT3 and the fourth portion PT4 may have a rectangular shape, but the shapes of the third portion PT3 and the fourth portion PT4 are not limited thereto. For example, the fourth portion PT4 may have a rectangular shape extending longer in the first direction DR1.

The fourth portion PT4 may extend in the first direction DR1 from a side of the third portion PT3 of both sides of the third portion PT3 opposite to each other in the first direction DR1. A width W4 of the fourth portion PT4 in the second direction DR2 may be less than a width W3 of the third portion PT3. The third portion PT3 may face (or be adjacent to) the second portion PT2 in the second direction DR2. The fourth portion PT4 may face (or be adjacent to) the first portion PT1 in the second direction DR2. The second emission area PA2 may overlap (or cover) the third portion PT3. Although the third portion PT3 is illustrated to have the substantially same shape as the second emission area PA2_, embodiments are not limited thereto, and the third portion PT3 may have a different shape from that of the second emission area PA2. The fourth portion PT4 may overlap (or cover) the non-emission area NPA.

A side of the third portion PT3 extending in the first direction DR1 and a side of the fourth portion PT4 extending in the first direction DR1 may be disposed along a second line. According to this structure, the second quantum dot layer QDL2 may have a shape in which a shape "L" is inverted to left and right sides.

For example, a side of the third portion PT3 may indicate the right side of the third portion PT3, and a side of the fourth portion PT4 may indicate the right side of the fourth portion PT4. For example, the first line may correspond to the left sides of the first and second portions PT1 and PT2, and the second line may correspond to the right sides of the the third and fourth portions PT3 and PT4.

The first light L1 generated in the second emission area PA2 may be transmitted to the third portion PT3. The third portion PT3 may convert the first light L1 transmitted from the second emission area PA2 into the third light L3. The fourth portion PT4 may not receive the first light L1. For example, the fourth portion PT4 may not perform the light conversion operation for converting the first light L1 into the third light L3.

The light transmitting layer LTL may include a fifth portion PT5 extending in the first direction DR1 and a sixth portion PT6 extending from the fifth portion PT5 in the first direction DR1. The sixth portion PT6 may extend from a side of the fifth portion PT5 of both sides of the fifth portion PT5 opposite to each other in the first direction DR1. The third emission area PA3 may overlap (or face) the fifth portion PT5, and the sixth portion PT6 may overlap (or face) the non-emission area NPA. For example, the fifth portion PT5 may have a rectangular shape extending longer in the first direction DR1.

Each of the first portion PT1, the third portion PT3, and the fifth portion PT5 may have an area ratio (e.g., a predetermined area ratio). A surface area of each of the first portion PT1, the third portion PT3, and the fifth portion PT5 may be determined according to the area ratio. The light transmitting layer LTL may include the fifth portion PT5 and the sixth portion PT6, but the sixth portion PT6 may be omitted. For example, the light transmitting layer LTL may include only the fifth portion PT5.

Figure 7:
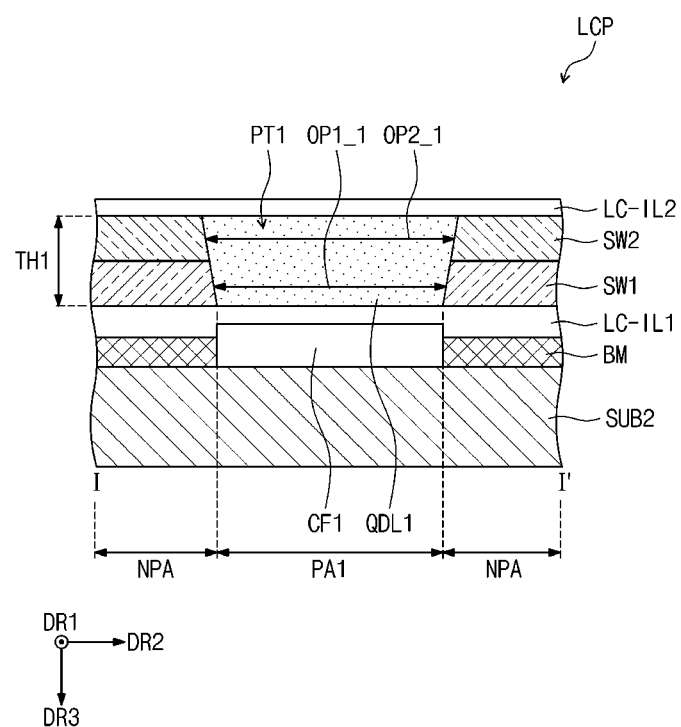
FIG. 7 is a schematic cross-sectional view taken along line I-I' of FIG. 6.
Figure 8:
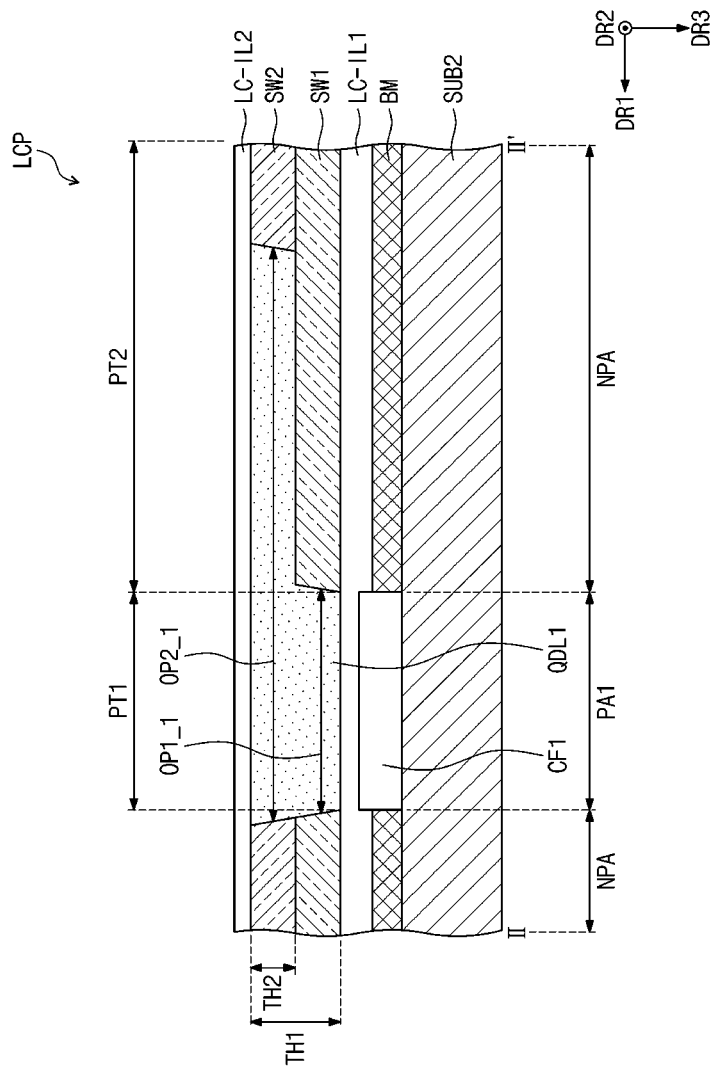
FIG. 8 is a schematic cross-sectional view taken along line II-II' of FIG. 6.
Figure 9:
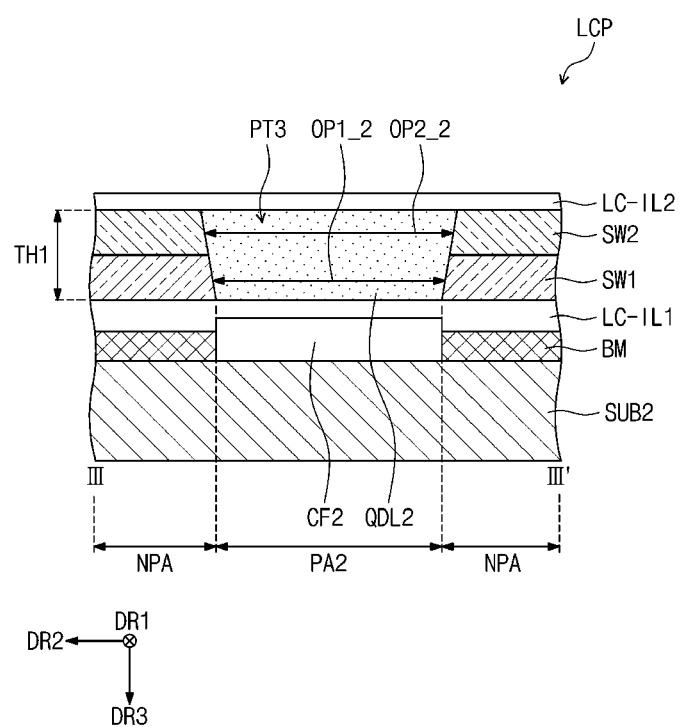
FIG. 9 is a schematic cross-sectional view taken along line of FIG. 6.
Figure 10:
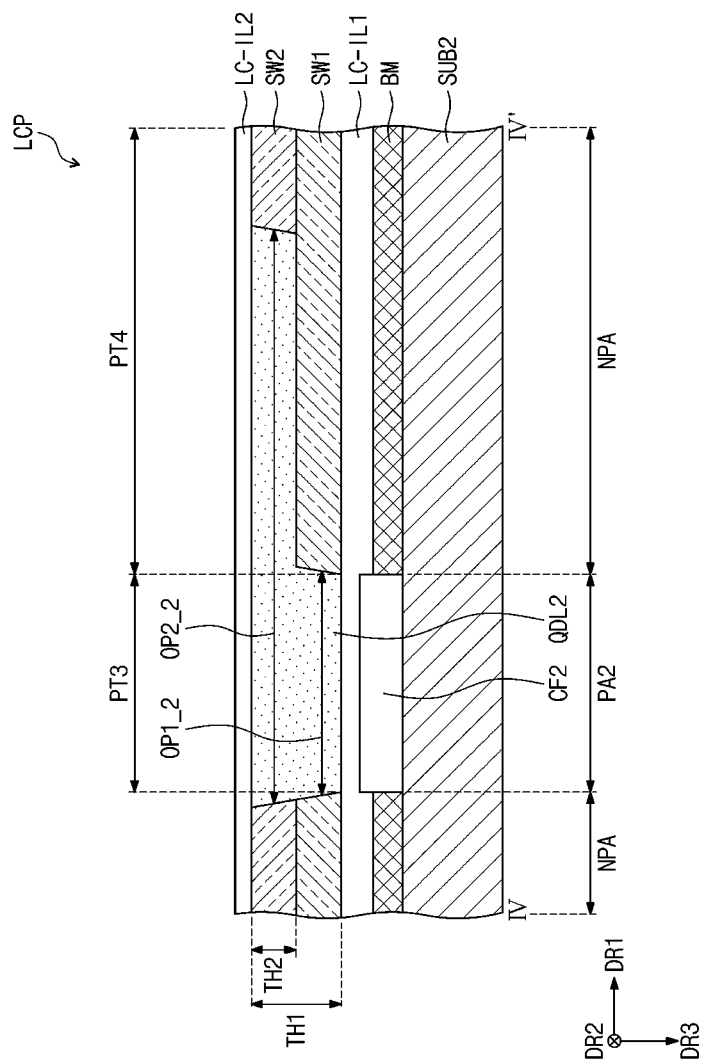
FIG. 10 is a schematic cross-sectional view taken along line IV-IV' illustrated in FIG. 6.
Figure 11:
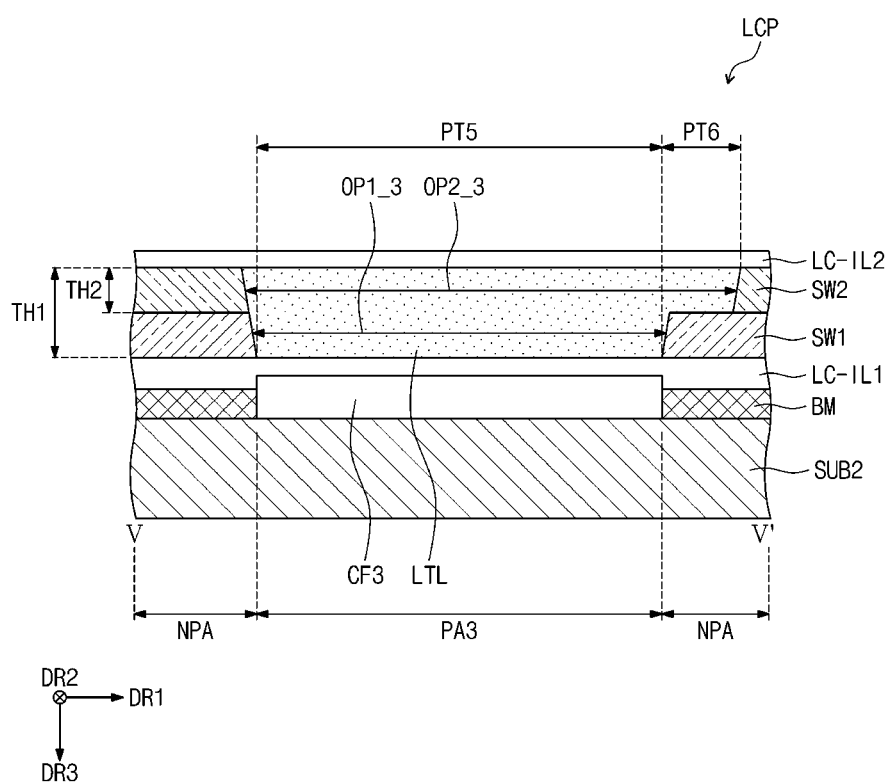
FIG. 11 is a schematic cross-sectional view taken along line V-V illustrated in FIG. 6.

FIG. 7 is a schematic cross-sectional view taken along line I-I' of FIG. 6. FIG. 8 is a schematic cross-sectional view taken along line II-II' of FIG. 6. FIG. 9 is a schematic cross-sectional view taken along line of FIG. 6. FIG. 10 is a schematic cross-sectional view taken along line IV-IV' illustrated in FIG. 6. FIG. 11 is a schematic cross-sectional view taken along line V-V illustrated in FIG. 6.

For example, FIGS. 7, 8, 9, 10, and 11 illustrate a schematic cross-section of the light conversion part LCP. For example, in FIGS. 7, 8, 9, 10, and 11, the first, second and third color filters CF1, CF2, CF3, the first and second barrier layers SW1 and SW2, the first and second quantum dot layers QDL1 and QDL2, and the light transmitting layer LTL are illustrated to be disposed on the second substrate SUB2.

Referring to FIGS. 7 and 8, the first barrier layer SW1 may overlap (or cover) the non-emission area NPA. A first sub opening OP1_1 may be formed in the first barrier layer SW1. The first sub opening OP1_1 may overlap the first emission area PA1. The first sub opening OP1_1 may be formed to overlap the first portion PT1. The first portion PT1 may be disposed in the first sub opening OP1_1.

A fourth sub opening OP2_1 may be formed in the second barrier layer SW2. The fourth sub opening OP2_1 may be formed to overlap the first and second portions PT1 and PT2. The first and second portions PT1 and PT2 may be disposed in the fourth sub opening OP2_1. A thickness TH1 of the first portion PT1 may be greater than a thickness TH2 of the second portion PT2 in the third direction DR3.

Referring to FIGS. 9 and 10, a second sub opening OP1_2 may be formed in the first barrier layer SW1. The second sub opening OP1_2 may overlap the second emission area PA2. The second sub opening OP1_2 may be formed to overlap the third portion PT3. The third portion PT3 may be disposed in the second sub opening OP1_2.

A fifth sub opening OP2_2 may be formed in the second barrier layer SW2. The fifth sub opening OP2_2 may be formed to overlap the third and fourth portions PT3 and PT4. The third and fourth portions PT3 and PT4 may be disposed in the fifth sub opening OP2_2. A thickness TH1 of the third portion PT3 may be greater than a thickness TH2 of the fourth portion PT4 in the third direction DR3.

Referring to FIG. 11, the third sub opening OP1_3 formed in the first barrier layer SW1 may overlap the third emission area PA3. The third sub opening OP1_3 may be formed to overlap the fifth portion PT5. The fifth portion PT5 may be disposed in the third sub opening OP1_3.

A sixth sub opening OP2_3 may be formed in the second barrier layer SW2. The sixth sub opening OP2_3 may be formed to overlap the fifth and sixth portions PT5 and PT6. The fifth and sixth portions PT5 and PT6 may be disposed in the sixth sub opening OP2_3. A thickness TH1 of the fifth portion PT5 may be greater than a thickness TH2 of the sixth portion PT2_3 in the third direction DR3.

The light transmitting layer LTL may include an organic material and scattering particles disposed in the organic material. For example, the organic material may include acrylate-based monomers. However, embodiments are not limited thereto, and the light transmitting layer LTL may include various polymer materials.

When viewed in a plan view, in the light conversion layer including quantum dots, as the area for converting light is similar to a square shape, light conversion efficiency may be improved.

Although the first quantum dot layer QDL1 extends lengthily in the first direction DR1, a portion that actually performs the light conversion operation may be the first portion PT1 of the first quantum dot layer QDL1. Since an area on which the first portion PT1 is disposed may have a shape similar to a square shape when compared to the entire area of the first quantum dot layer QDL1, the light conversion efficiency of the first quantum dot layer QDL1 may be improved.

Although the second quantum dot layer QDL2 extends lengthily in the first direction DR1, a portion that actually performs the light conversion operation may be the third portion PT3 of the second quantum dot layer QDL2. Since an area on which the third portion PT3 is disposed may have a shape similar to a square shape when compared to the entire area of the second quantum dot layer QDL2, the light conversion efficiency of the second quantum dot layer QDL2 may be improved.

Figure 12:
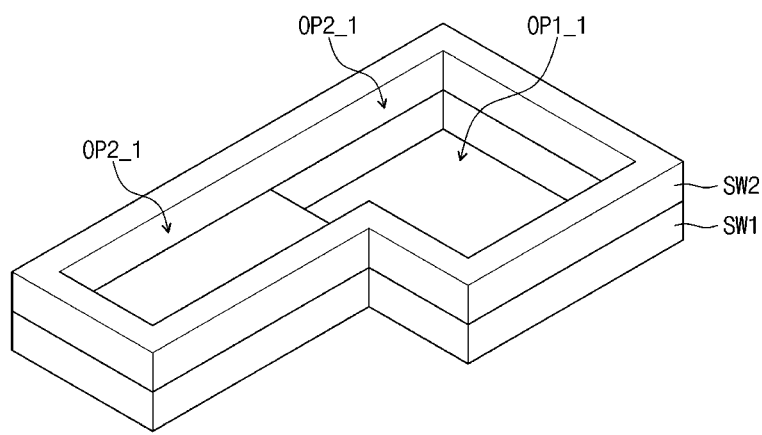
FIGS. 12, 13, and 14 are schematic views for explaining a method for manufacturing a first quantum dot layer.
Figure 13:
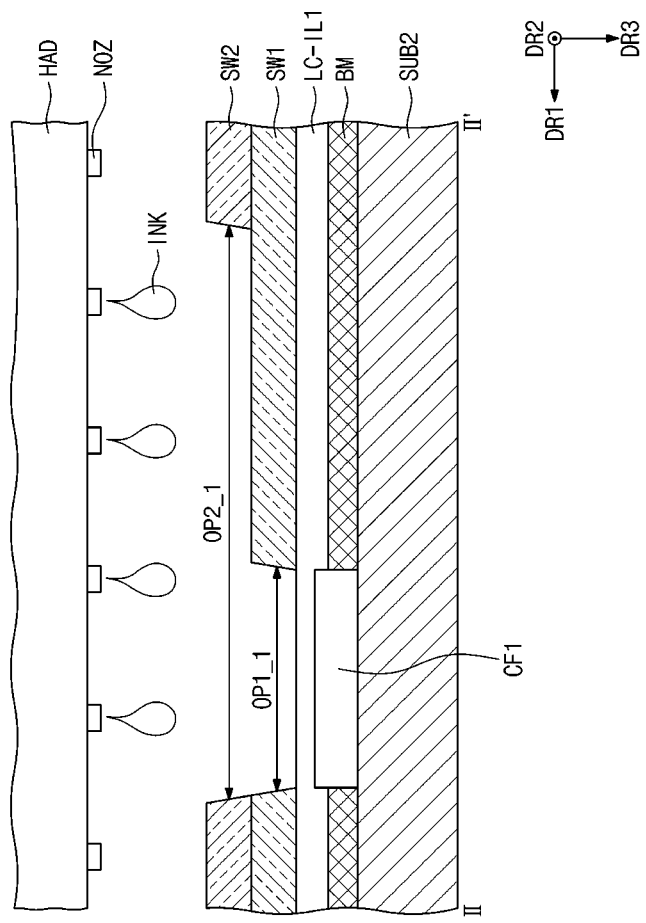
Figure 14:
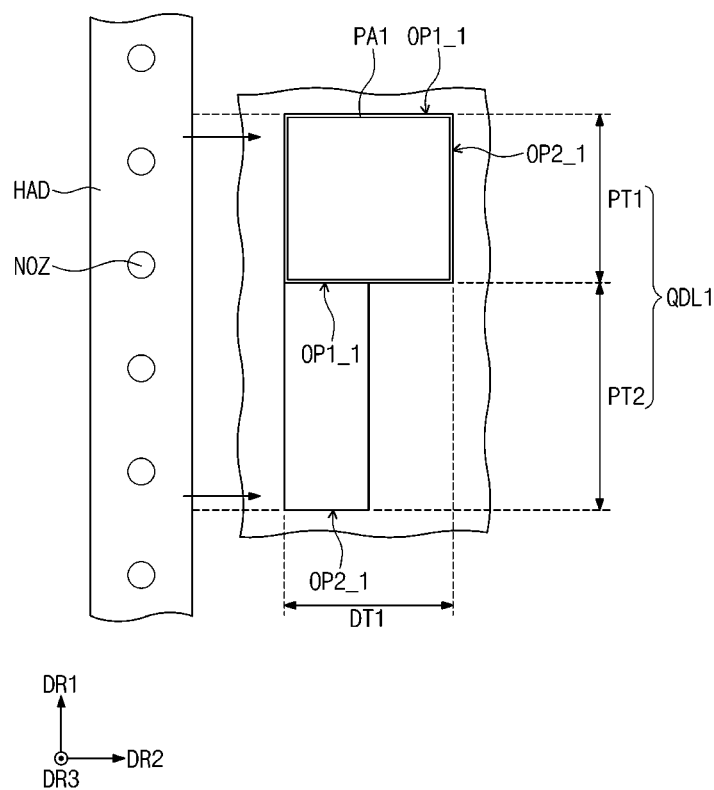

FIGS. 12, 13, and 14 are schematic views for explaining a method for manufacturing a first quantum dot layer.

Hereinafter, for example, a method for manufacturing a first quantum dot layer QDL1 will be described, but a second quantum dot layer QDL2 may also be manufactured in a similar manner. Also, for convenience of explanation, FIG. 12 is a schematic perspective view of first and second barrier layers SW1 and SW2 is illustrated in FIG. 12, and FIG. 13 is a schematic cross-sectional view corresponding to FIG. 8.

Referring to FIG. 12, the first barrier layer SW1 in which a first sub opening OP1_1 is formed may be formed. A second barrier layer SW2 in which a fourth sub opening OP2_1 is formed may be disposed on the first barrier layer SW1.

Referring to FIG. 13, a head HAD for providing ink INK may be disposed on a second substrate SUB2. The head HAD may include nozzles NOZ for discharging (or injecting) the ink INK. The predetermined number of nozzles NOZ may be disposed on the first and fourth sub openings OP1_1 and OP2_1.

For example, four nozzles NOZ are disposed in the first and fourth sub openings OP1_1 and OP2_1, but the number of nozzles NOZ disposed in the first and fourth sub openings OP1_1 and OP2_1 is not limited thereto. The number of nozzles NOZ may vary according to lengths of the first and fourth sub openings OP1_1 and OP2_1 extending in the first direction DR1.

The ink INK discharged from the nozzles NOZ may be provided to the first and fourth sub openings OP1_1 and OP2_1. The ink INK provided in the first and fourth sub openings OP1_1 and OP2_1 may be cured to form the first quantum dot layer QDL1.

A top surface of the second barrier layer SW2 may have a liquid repellent property. As illustrated in FIG. 5, the top surface of the second barrier layer SW2 may be one surface of the second barrier layer SW2 facing a display panel DP. Referring to FIG. 5, one surface of the second barrier layer SW2 may be a bottom surface of the second barrier layer SW2. Since the top surface of the second barrier layer SW2 has the liquid repellent property, in case that the ink INK is slightly excessively provided to the first and fourth sub openings OP1_1 and OP2_1, the ink INK may not overflow over (or beyond) the second barrier layer SW2.

Referring to FIGS. 13 and 14, when viewed in a plan view, the nozzles NOZ may be arranged in the first direction DR1. The nozzles NOZ may move in the second direction DR2. Some of the nozzles NOZ may provide ink INK to the first and fourth sub openings OP1_1 and OP2_1.

Figure 15:
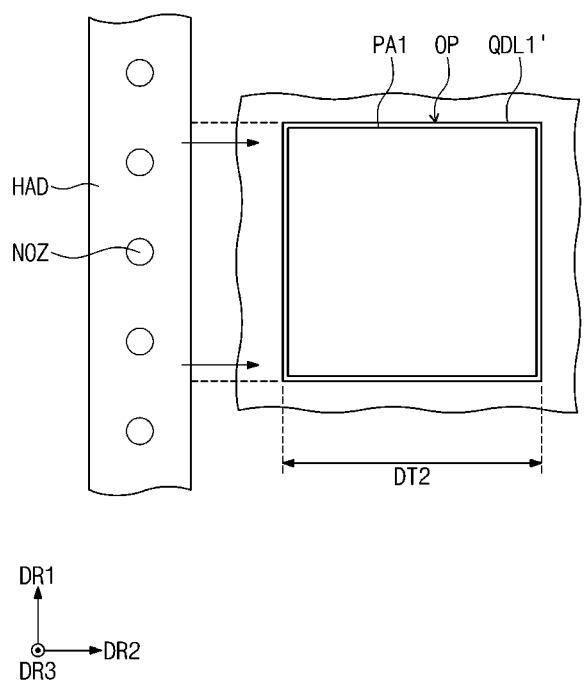
FIG. 15 is a schematic view for explaining a method for manufacturing a first quantum dot layer according to a comparative example.

FIG. 15 is a schematic view for explaining a method for manufacturing a first quantum dot layer according to a comparative example.

Referring to FIG. 15, a first quantum dot layer QDL1' may have the same surface area as the first quantum dot layer QDL1 illustrated in FIG. 14 and may have a square shape. A barrier in which a square opening OP for disposing the first quantum dot layer QDL1' is formed may be provided on a substrate. For example, the first quantum dot layer QDL1' has a width greater than that of the first quantum dot layer QDL1 in the second direction DR2 and has a width less than that of the first quantum dot layer QDL1 in the first direction DR1.

Referring to FIGS. 14 and 15, since the first quantum dot layer QDL1' has a width less than that of the first quantum dot layer QDL1 in the first direction DR1, the number of nozzles NOZ used for forming the first quantum dot layer QDL1' may be reduced. For example, four nozzles NOZ may be used to form the first quantum dot layer QDL1 illustrated in FIG. 14, but three nozzles NOZ may be used to form the first quantum dot layer QDL1' illustrated in FIG. 15.

For example, since the first quantum dot layer QDL1' has the width greater than that of the first quantum dot layer QDL1 in the second direction DR2, in order to form the first quantum dot layer QDL1', a moving distance of each of the nozzles NOZ that move in the second direction DR2 may increase. For example, the nozzles NOZ for forming the first quantum dot layer QDL1 illustrated in FIG. 14 may move by a first distance DT1, but each of the nozzles NOZ for forming the first quantum dot layer QDL1' illustrated in FIG. 15 may move by a second distance DT2 greater than the first distance DT1.

As the number of used nozzles NOZ decreases, and the moving distance of each of the nozzles NOZ may increase, a time for manufacturing the quantum dot layer may increase. In an embodiment, since the number of nozzles NOZ for forming the first quantum dot layer QDL1 increases, and the moving distance of each of the nozzles NOZ may decrease as compared to the first quantum dot layer QDL1', the time for manufacturing the first quantum dot layer QDL1 may be reduced. Although a method for manufacturing the first quantum dot layer QDL1 has been described as an example, the time for manufacturing the second quantum dot layer QDL2 may be reduced, like the first quantum dot layer QDL1.

As a result, the display device DD according to an embodiment may include the first and second quantum dot layers QDL1 and QDL2, each of which has an "L" shape, to improve light conversion efficiency and reduce the time for manufacturing the first and second quantum dot layers QDL1 and QDL2.

FIGS. 16, 17, 18, 19, 20, 21, and 22 are schematic views illustrating configurations of first, second, and third emission areas, first and second quantum dot layers, and a light transmitting layer according to various embodiments.

Hereinafter, differences in configurations of the first and second emission areas PA1_1 to PA1_5 and PA2_1 to PA2_5 and the first and second quantum dot layers QDL1_1 to QDL1_5 and QDL2_1 to QDL2_5, which are illustrated in FIGS. 16 to 22, with respect to the first and second emission areas PA1 and PA2 and the first and second quantum dot layers QDL1 and QDL2 illustrated in FIG. 6 will be described. Configurations of a third emission area PA3 and a light transmitting layer LTL, which are illustrated in FIGS. 16 to 22, are the substantially same as those of the third emission area PA3 and the light transmitting layer LTL, which are illustrated in FIG. 6, and thus, their descriptions will be omitted for descriptive convenience.

Figure 16:
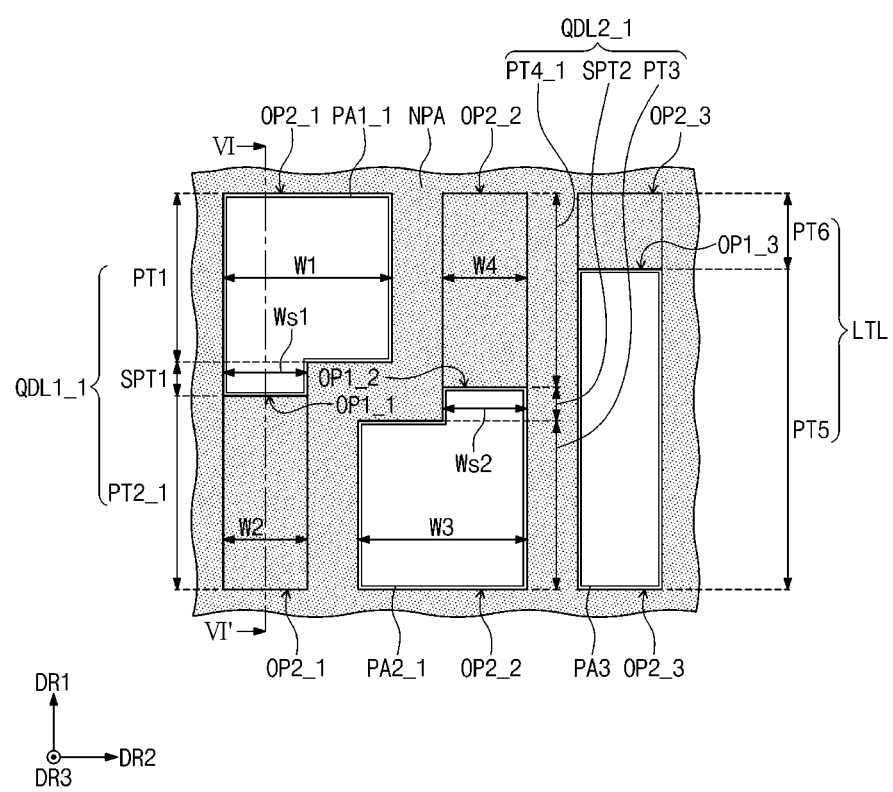
FIGS. 16, 17, 18, 19, 20, 21, and 22 are schematic views illustrating configurations of first, second, and third emission areas, first and second quantum dot layers, and a light transmitting layer according to various embodiments.

Referring to FIG. 16, the first quantum dot layer QDL1_1 may include a first portion PT1, a second portion PT2_1, and a first sub portion SPT1 disposed between the first portion PT1 and the second portion PT2_1. The first sub portion SPT1 may extend from the first portion PT1. The second portion PT2_1 may extend from the first sub portion SPT1.

The first sub portion SPT1 may have a width Ws1 substantially equal to a width W2 of the second portion PT2 in the second direction DR2. The first sub portion SPT1 may have the width Ws1 less than a width W1 of the first portion PT1 in the second direction DR2. Substantially, the first portion PT1 illustrated in FIG. 6 may protrude toward the second portion PT2 to form the first sub portion SPT1. The first sub portion SPT1 may have the substantially same thickness as that of the first portion PT1 in the third direction DR3.

Figure 17:
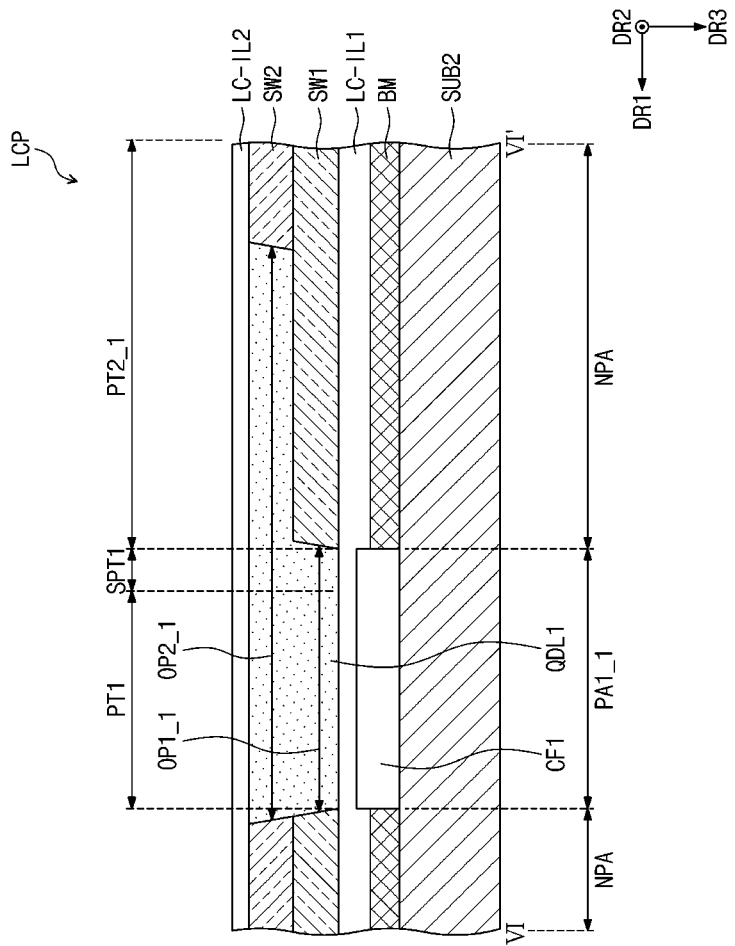

FIG. 17 is a schematic cross-sectional view taken along line VI-VI' illustrated in FIG. 16.

Referring to FIGS. 16 and 17, a first color filter CF1 may overlap (or cover) the first emission area PA1_1, and the first emission area PA1_1 may overlap a first portion PT1 and a first sub portion SPT1. The second portion PT2_1 may overlap a non-emission area NPA.

A first sub opening OP1_1 may be formed in a first barrier layer SW1. The first sub opening OP1_1 may be formed to overlap the first portion PT1 and the first sub portion SPT1. A fourth sub opening OP2_1 may be formed in a second barrier layer SW2. The fourth sub opening OP2_1 may be formed to overlap the first portion PT1, the second portion PT2_1, and the first sub portion SPT1.

First light L1 generated in the first emission area PA1_1 may be transmitted to the first portion PT1 and the first sub portion SPT1. The first portion PT1 and the first sub portion SPT1 may convert the first light L1 transmitted from the first emission area PA1 into second light L2. The second portion PT2 may not receive the first light L1.

Referring to FIG. 16, the second quantum dot layer QDL2_1 may include a third portion PT3, a fourth portion PT4_1, and a second sub portion SPT2 disposed between the third portion PT3 and the fourth portion PT4_1. The second sub portion SPT2 may extend from the third portion PT3. The fourth portion PT4_1 may extend from the second sub portion SPT2. The second sub portion SPT2 may have a width Ws2 substantially equal to a width W4 of the fourth portion PT4_1 in the second direction DR2. The second sub portion SPT2 may have the width Ws2 less than a width W3 of the third portion PT3 in the second direction DR2. Substantially, the third portion PT3 illustrated in FIG. 6 may protrude toward the fourth portion PT4_1 to form the second sub portion SPT2.

The second emission area PA2_1 may overlap (or face) the third portion PT3 and the second sub portion SPT2. The fourth portion PT4_1 may overlap the non-emission area NPA. A cross-sectional structure of the second quantum dot layer QDL2_1 may be substantially similar to that of the first quantum dot layer QDL1_1. For example, the second sub opening OP1_2 may be formed to overlap the third portion PT3 and the second sub portion SPT2. The fifth sub opening OP2_2 may be formed to overlap the third portion PT3, the fourth portion PT4_1, and the second sub portion SPT2.

The first light L1 generated in the second emission area PA2_1 may be transmitted to the third portion PT3 and the second sub portion SPT2. The third portion PT3 and the second sub portion SPT2 may convert the first light L1 transmitted from the second emission area PA2_1 into the third light L3. The fourth portion PT4_1 may not receive the first light L1.

Figure 18:
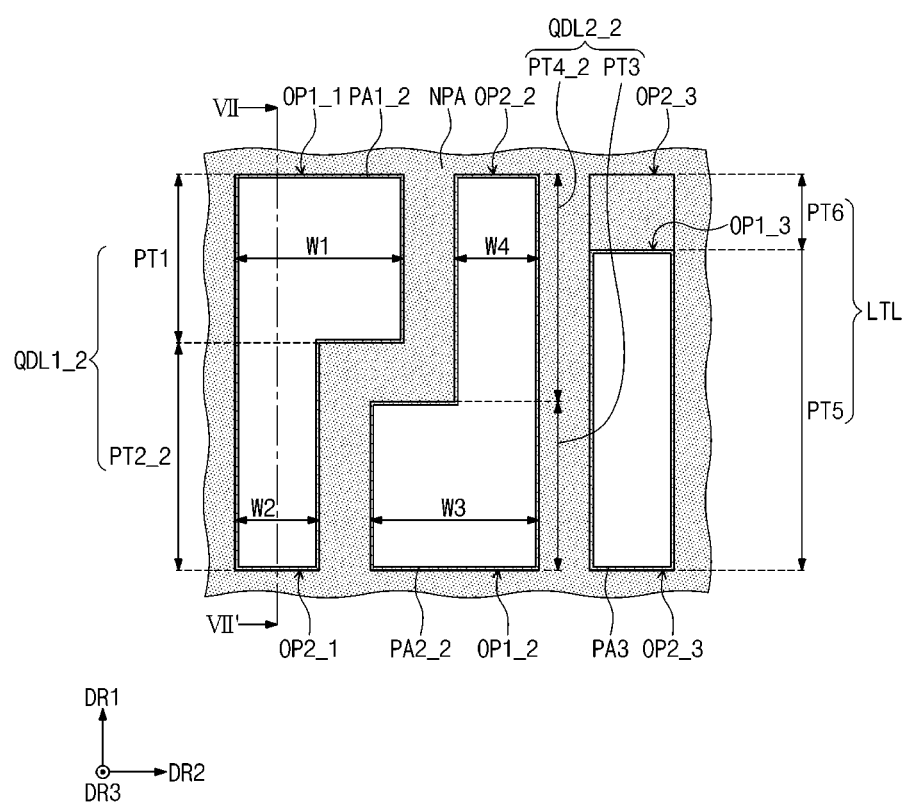

Referring to FIG. 18, the first emission area PA1_2 may overlap the first quantum dot layer QDL1_2. For example, the first emission area PA1_2 may have the substantially same shape as the first quantum dot layer QDL1_2. The second emission area PA2_2 may overlap the second quantum dot layer QDL2_2. For example, the second emission area PA2_2 may have the substantially same shape as the second quantum dot layer QDL2_2.

The first quantum dot layer QDL1_2 may include a first portion PT1 and a second portion PT2_2 extending from a side of the first portion PT1 in the first direction DR1. A width W2 of the second portion PT2_2 may be less than a width W1 of the first portion PT1 in the second direction DR2. The first emission area PA1_2 may overlap the first portion PT1 and the second portion PT2_2.

The second quantum dot layer QDL2_2 may include a third portion PT3 and a fourth portion PT4_2 extending from a side of the third portion PT3 in the first direction DR1. A width W4 of the fourth portion PT4_2 may be less than a width W3 of the third portion PT3 in the second direction DR2. The second emission area PA2_2 may overlap the third portion PT3 and the fourth portion PT4_2.

Figure 19:
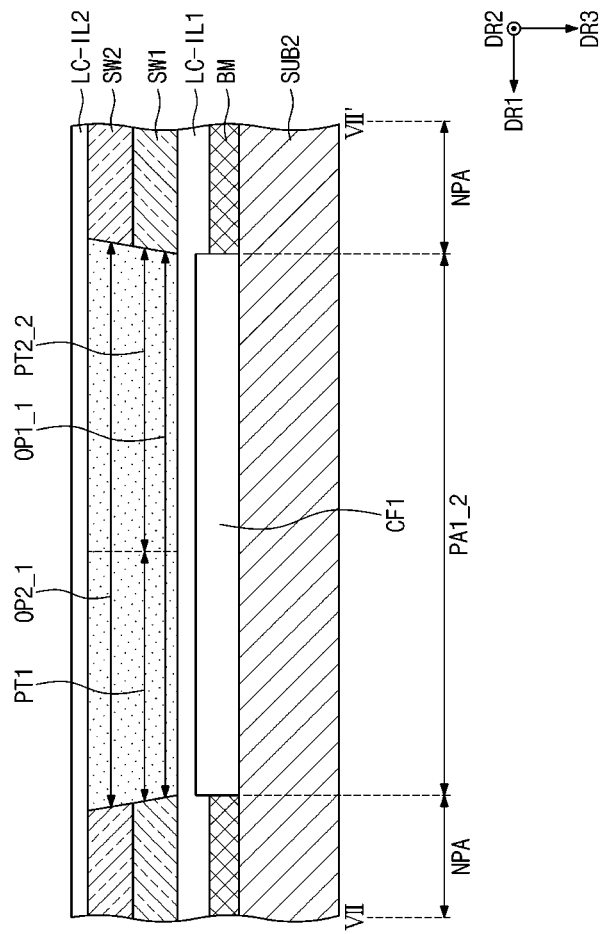

FIG. 19 is a schematic cross-sectional view taken along line VII-VII' of FIG. 18.

Referring to FIGS. 18 and 19, the first sub opening OP1_1 and the fourth sub opening OP2_1 may be formed to overlap the first emission area PA1_2.

The first sub opening OP1_1 in which the first portion PT1 and the second portion PT2_2 are disposed may be formed in a first barrier layer SW1. The fourth sub opening OP2_1 in which the first portion PT1 and the second portion PT2_2 are disposed may be formed in a second barrier layer SW2. The first portion PT1 and the second portion PT2_2 may be integral with each other and may have the substantially same thickness. The second sub opening OP1_2 and the fifth sub opening OP2_2 for disposing the third and fourth portions PT3 and PT4_2 are formed to overlap the second emission area PA2_2.

Figure 20:
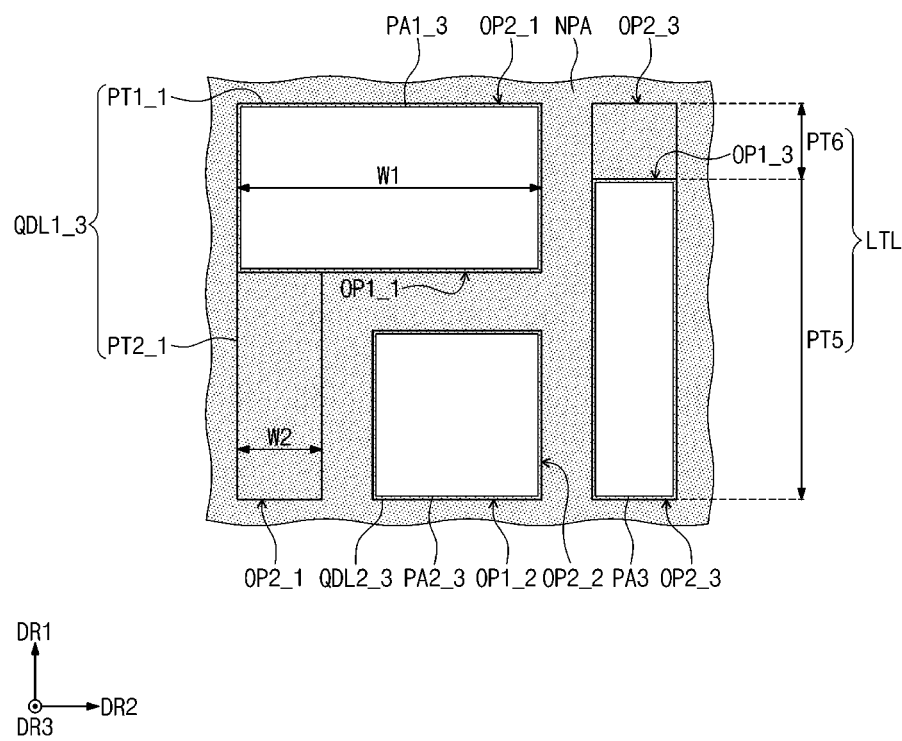

Referring to FIG. 20, each of the first emission area PA1_3 and the second emission area PA2_3 may have a rectangular shape. The first emission area PA1_3 may have a rectangular shape extending longer in the second direction DR2.

The first quantum dot layer QDL1_3 may include a first portion PT1_1 overlapping the first emission area PA1_3 and a second portion PT21 extending from a side of the first portion PT1_1 in the first direction DR1. The first portion PT1_1 may have a rectangular shape and may extend in the second direction DR2. The second portion PT2_1 may overlap a non-emission area NPA. A width W2 of the second portion PT2_1 in the second direction DR2 may be less than a width W1 of the first portion PT1_1.

The second quantum dot layer QDL2_3 may have a rectangular shape and overlap the second emission area PA2_3. Compared to the second quantum dot layer QDL2 illustrated in FIG. 6, the second quantum dot layer QDL2_3 may not include the fourth portion PT4. The second quantum dot layer QDL2_3 may face (or be adjacent to) the first portion PT1_1 in the first direction DR1 and may face (or be adjacent to) the second portion PT2_1 in the second direction DR2.

The first sub opening OP1_1 may be formed to overlap the first portion PT1_1. The second sub opening OP1_2 may be formed to overlap the second quantum dot layer QDL2_3. The second sub opening OP2_1 may be formed to overlap the first and second portions PT1_1 and PT2_1. The fifth sub opening OP2_2 may be formed to overlap the second quantum dot layer QDL2_3.

Figure 21:
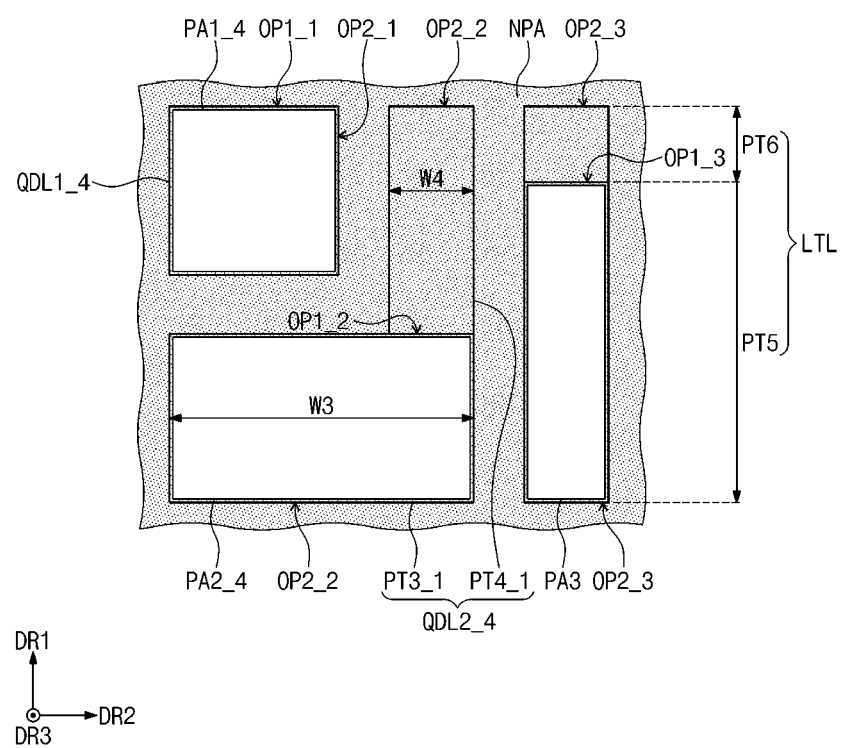

Referring to FIG. 21, each of the first emission area PA1_4 and the second emission area PA2_4 may have a rectangular shape. The second emission area PA2_4 may have a rectangular shape extending longer in the second direction DR2.

The second quantum dot layer QDL2_4 may include a third portion PT3_1 overlapping the second emission area PA2_4 and a fourth portion PT4_1 extending from a side of the third portion PT3_1 in the first direction DR1. The third portion PT3_1 has a rectangular shape and may extend in the second direction DR2. The fourth portion PT4_1 may overlap the non-emission area NPA. A width W4 of the fourth portion PT4_1 in the second direction DR2 may be less than a width W3 of the third portion PT3_1.

The first quantum dot layer QDL1_4 may have a rectangular shape and overlap the first emission area PA1_4. Compared to the first quantum dot layer QDL1_1 illustrated in FIG. 18, the first quantum dot layer QDL1_4 may not include the second portion PT2. The first quantum dot layer QDL1_4 may face the third portion PT3_1 in the first direction DR1 and may face the fourth portion PT4_1 in the second direction DR2.

The first sub opening OP1_1 may be formed to overlap the first quantum dot layer QDL1_4. The second sub opening OP1_2 may be formed to overlap the third portion PT3_1. The fourth opening OP2_1 may be formed to overlap the first quantum dot layer QDL1_4. The fifth opening OP2_5 may be formed to overlap the third and fourth portions PT3_1 and PT4_1.

Figure 22:
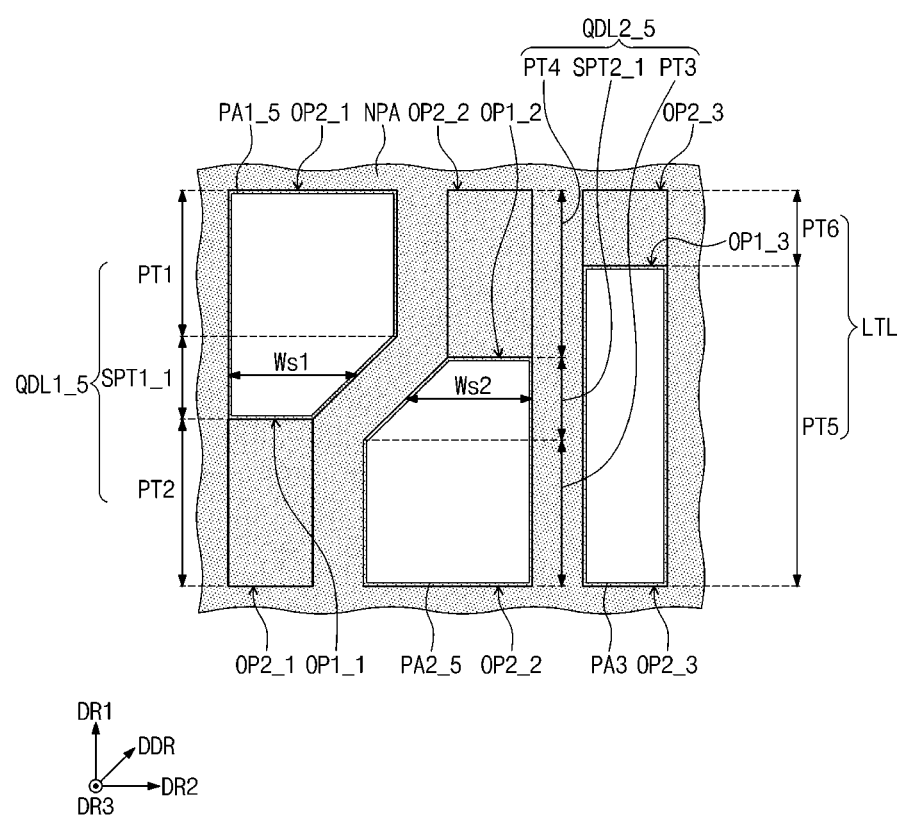

Referring to FIG. 22, the first quantum dot layer QDL1_5 includes a first portion PT1, a second portion PT2, and a first sub portion SPT1_1 disposed between the first portion PT1 and the second portion PT2. A width Ws1 of the first sub portion SPT1_1 in the second direction DR2 may gradually decrease as being closer to the second portion PT2 from the first portion PT1.

The first emission area PA1_5 may overlap the first portion PT1 and the first sub portion SPT1_1. The second portion PT2 may overlap the non-emission area NPA. The first sub opening OP1_1 may be formed to overlap the first portion PT1 and the first sub portion SPT1_1. The fourth sub opening OP2_1 may be formed to overlap the first and second portions PT1 and PT2 and the first sub portion SPT1_1.

The second quantum dot layer QDL2_5 may include a third portion PT3, a fourth portion PT4, and a second sub portion SPT2_1 disposed between the third portion PT3 and the fourth portion PT4. A width Ws2 of the second sub portion SPT2_1 in the second direction DR2 may gradually decrease as being closer to the fourth portion PT4 from the third portion PT3.

The second emission area PA2_5 may overlap the third portion PT3 and the second sub portion SPT2_1. The fourth portion PT4 may overlap the non-emission area NPA. The second sub opening OP1_2 may be formed to overlap the third portion PT3 and the second sub portion SPT2_1. The second sub opening OP1_2 may be formed to overlap the third portion PT3 and the second sub portion SPT2_1.

One surface of the first sub portion SPT1_1 may have an inclined surface, and another surface of the first sub portion SPT1_1 opposite to the one surface of the first sub portion SPT1_1 may extend in the first direction DR1. One surface of the second sub portion SPT2_1 may have an inclined surface, and another surface of the second sub portion SPT2_1 opposite to the one surface of the second sub portion SPT2_1 may extend in the first direction DR1.

One surface of the first sub portion SPT1_1 and one surface of the second sub portion SPT2_1 may face each other and may have inclined surfaces extending in a diagonal direction DDR intersecting the first and second directions DR1 and DR2, respectively. The diagonal direction DDR may be defined as a direction intersecting the first and second directions DR1 and DR2 on the plane defined by the first and second directions DR1 and DR2.

Figure 23:
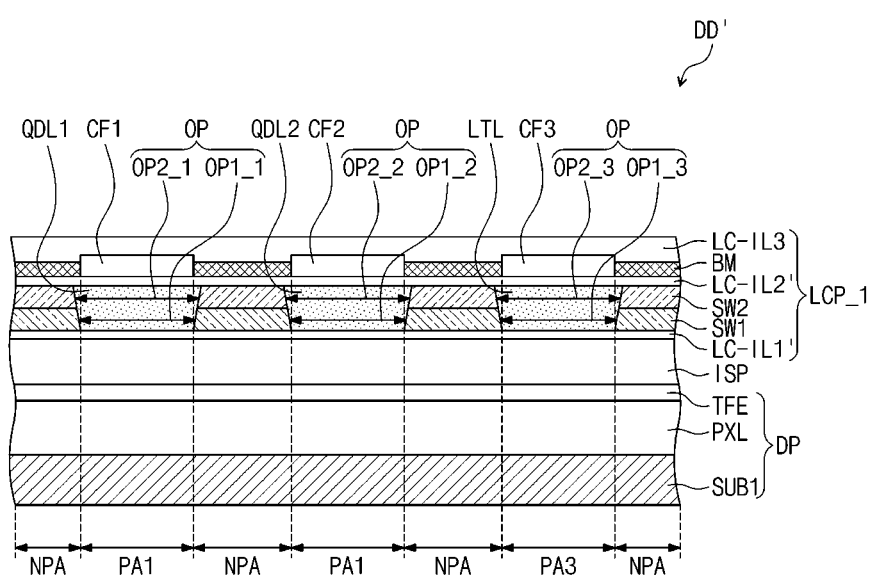
FIG. 23 is a schematic cross-sectional view illustrating an example of first, second, and third emission areas of a display device according to an embodiment.

FIG. 23 is a schematic cross-sectional view illustrating an example of first, second, and third emission areas of a display device according to an embodiment.

For convenience of description, FIG. 23 illustrates a schematic cross-sectional view corresponding to the schematic cross-section view of FIG. 5.

Referring to FIG. 23, configurations of a display panel DP and an input sensing part ISP are substantially the same as those of the display panel DP and the input sensing part ISP, which are illustrated in FIG. 5, and thus their descriptions will be omitted for descriptive convenience. A first insulating layer LC-IL1' may be disposed on the input sensing part ISP. First and second quantum dot layers QDL1 and QDL2, a light transmitting layer LTL, and first and second barrier layers SW1 and SW2 are disposed on the first insulating layer LC-IL I'.

The second barrier layer SW2 may be disposed on the first barrier layer SW1. First and second openings OP1_1, OP1_2, OP1_3, OP2_1, OP2_2, and OP2_3 overlapping first, second, and third emission areas PA1_, PA2 and PA3 may be formed in the first and second barrier layers SW1 and SW2, respectively. The first and second barrier layers SW1 and SW2 illustrated in FIG. 23 may have a structure in which the first and second barrier layers SW1 and SW2 illustrated in FIG. 5 are arranged in reverse, and substantially, may have the substantially same structure as the first and second barrier layers SW1 and SW2 illustrated in FIG. 5.

The first and second quantum dot layers QDL1 and QDL2 and the light transmitting layer LTL may overlap (or cover) the first, second, and third emission areas PA1_, PA2 and PA3, respectively. The first and second quantum dot layers QDL1 and QDL2 and the light transmitting layer LTL may be disposed in the first and second openings OP1_1, OP1_2, OP1_3, OP2_1, OP2_2, and OP2_3. Configurations of the first and second quantum dot layers QDL1 and QDL2 and the light transmitting layer LTL may be substantially the same as those of the first and second quantum dot layers QDL1 and QDL2 and the light transmitting layer LTL, which are illustrated in FIG. 6.

A second insulating layer LC-IL2' may be disposed on the first and second quantum dot layers QDL1 and QDL2, the light transmitting layer LTL, and the first and second barrier layers SW1 and SW2. First, second, and third color filters CF1, CF2, and CF3 and a black matrix BM may be disposed on the second insulating layer LC-IL2'. The first, second, and third color filters CF1, CF2, and CF3 may overlap (or cover) the first, second, and third emission areas PA1_, PA2_, and PA3, respectively. The black matrix BM may overlap (or cover) a non-emission area NPA. A third insulating layer LC-IL3 may be disposed on the first, second, and third color filters CF1, CF2, and CF3 and the black matrix BM.

Compared to the display device DD of FIG. 5, a display device DD' illustrated in FIG. 23 may not include the second substrate SUB2.

Figure 24:
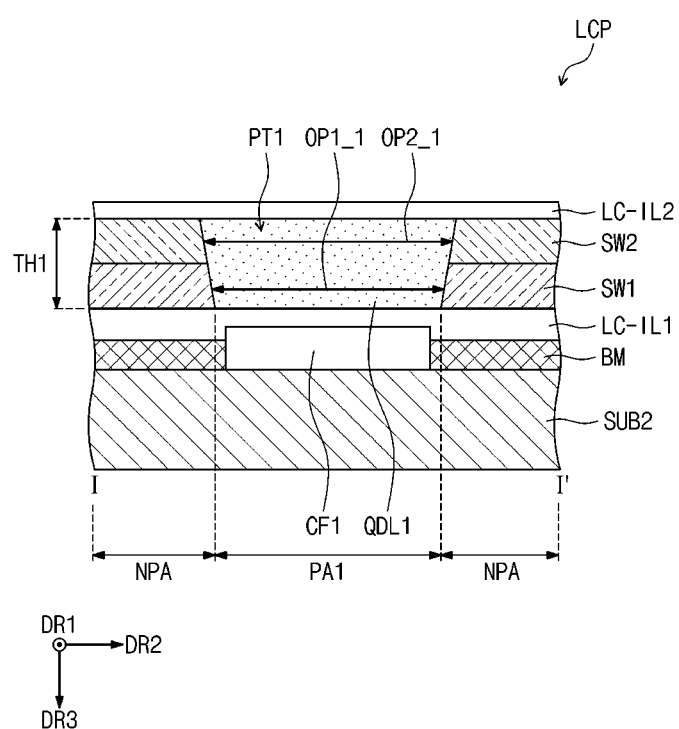
FIG. 24 is a schematic cross-sectional view of a color filter and a quantum dot layer according to an embodiment.

FIG. 24 is a schematic cross-sectional view of a color filter and a quantum dot layer according to an embodiment.

For example, cross-sections of a first quantum dot layer QDL1 and a first color filter CF1 are illustrated in FIG. 24.

Referring to FIG. 24, a width of the first color filter CF1 may be less than that of the first quantum dot layer QDL1. A width represents a numerical value measured in a horizontal direction, and in FIG. 24, for example, the width may be defined as a numerical value measured in the second direction DR2.

For example, although the width of the first color filter CF1 and the width of the first quantum dot layer QDL1 have been described, a width of each of the second and third color filters CF2 and CF3 may also be less than that of each of the second quantum dot layer QDL2 and the light transmitting layer LTL.

FIGS. 25, 26, 27, 28, and 29 are schematic views illustrating configurations of first and second quantum dot layers and a light transmitting layer according to various embodiments.

Hereinafter, differences in configuration of first and second quantum dot layers QDL1_6 to QDL1_9, QDL2_6 to QDL2_9 and a light transmitting layer LTL', which are illustrated in FIGS. 25 to 29, with respect to the configurations of the first and second quantum dot layers QDL1 and QDL2 and the light transmitting layer LTL, which are illustrated in FIG. 6, will be described.

Figure 25:
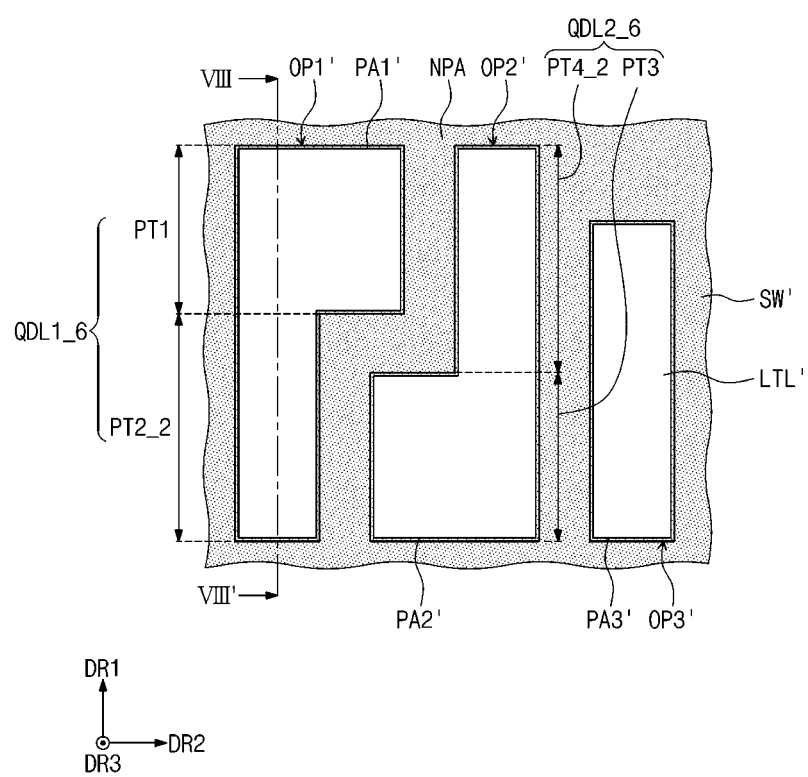
FIGS. 25, 26, 27, 28, and 29 are schematic views illustrating configurations of first and second quantum dot layers and a light transmitting layer according to various embodiments.

Referring to FIG. 25, configurations of the first quantum dot layer QDL1_6 and the second quantum dot layer QDL2_6 in a plan view may be substantially the same as the first quantum dot layer QDL1_2 and the second quantum dot layer QDL2_2, which are illustrated in FIG. 18. A configuration of the light transmitting layer LTL' in a plan view may be substantially the same as the configuration in which the sixth portion PT6 is removed from the light transmitting layer LTL illustrated in FIG. 18.

A first emission area PA1' may have the substantially same shape as the first quantum dot layer QDL1_6 in a plan view. A second emission area PA2' may have the substantially same shape as the second quantum dot layer QDL2_6 in a plan view. A third emission area PA3' may have the substantially same shape as the light transmitting layer LTL' in a plan view.

First, second, and third openings OP1', OP2', and OP3' may be formed in a barrier SW'. A first quantum dot layer QDL1_6 may be disposed in the first opening OP1'. A second quantum dot layer QDL2_6 may be disposed in the second opening OP2'. A light transmitting layer LTL may be disposed in the third opening OP3'.

Figure 26:
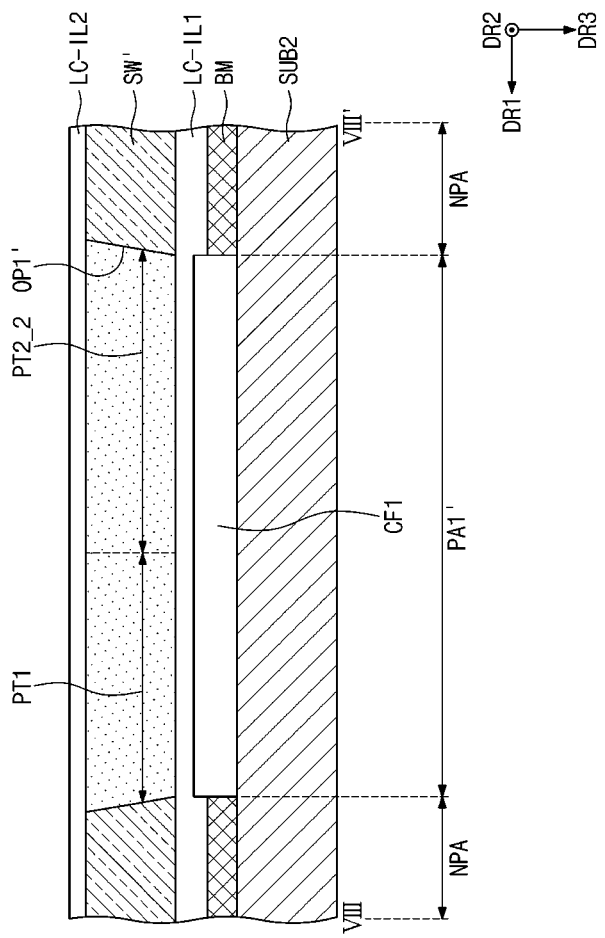

FIG. 26 is a schematic cross-sectional view taken along line VIII-VIII' illustrated in FIG. 25.

Referring to FIGS. 25 and 26, the first opening OP1' may be formed in the barrier SW'. Compared to the structure illustrated in FIG. 19, in FIG. 26, a single barrier SW' may be disposed on a second substrate SUB2, and the first opening OP1' may be formed in the barrier SW'. The second and third openings OP2' and OP3' may also be formed in the barrier SW'.

Figure 27:
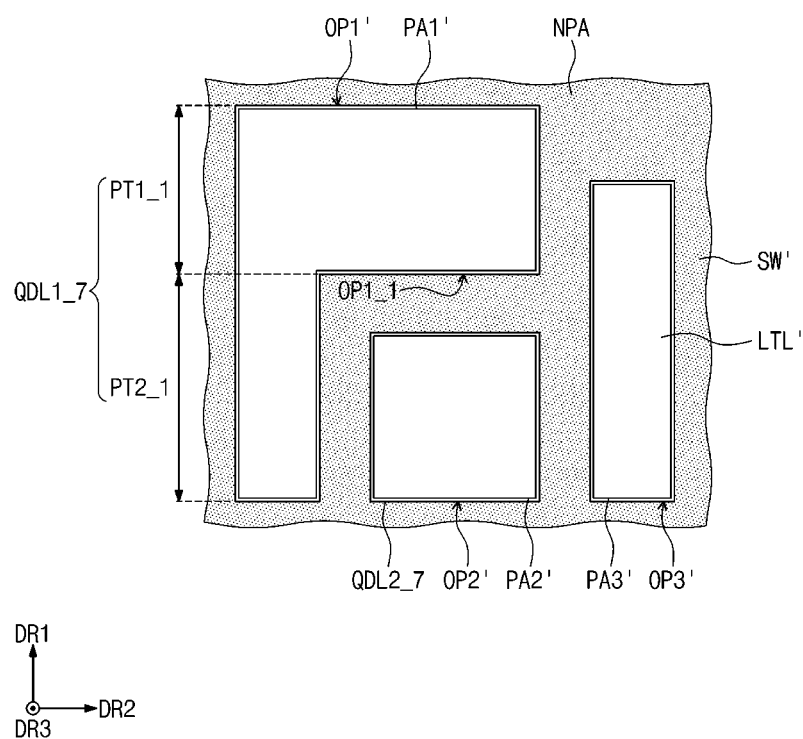
Figure 28:
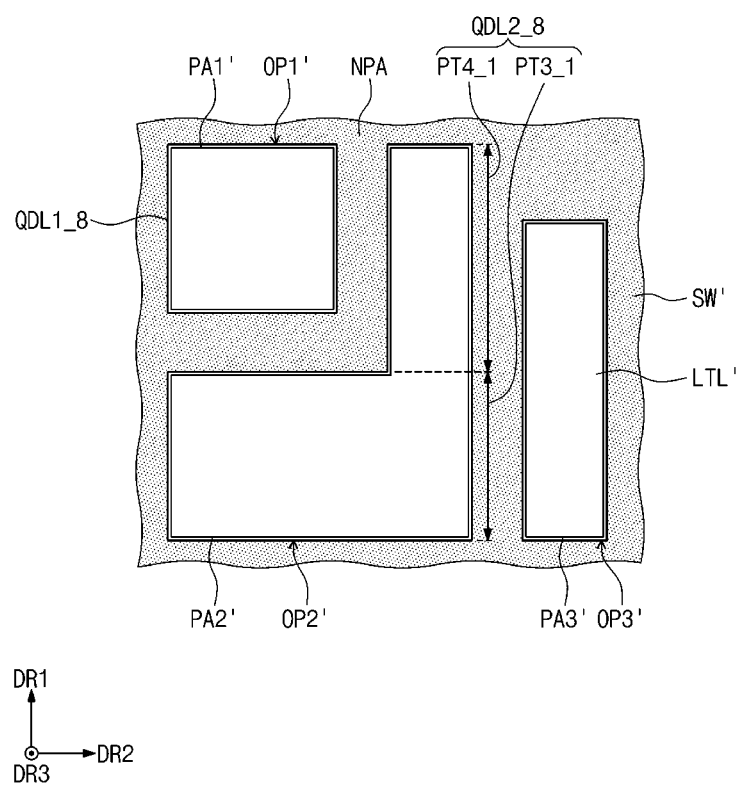
Figure 29:
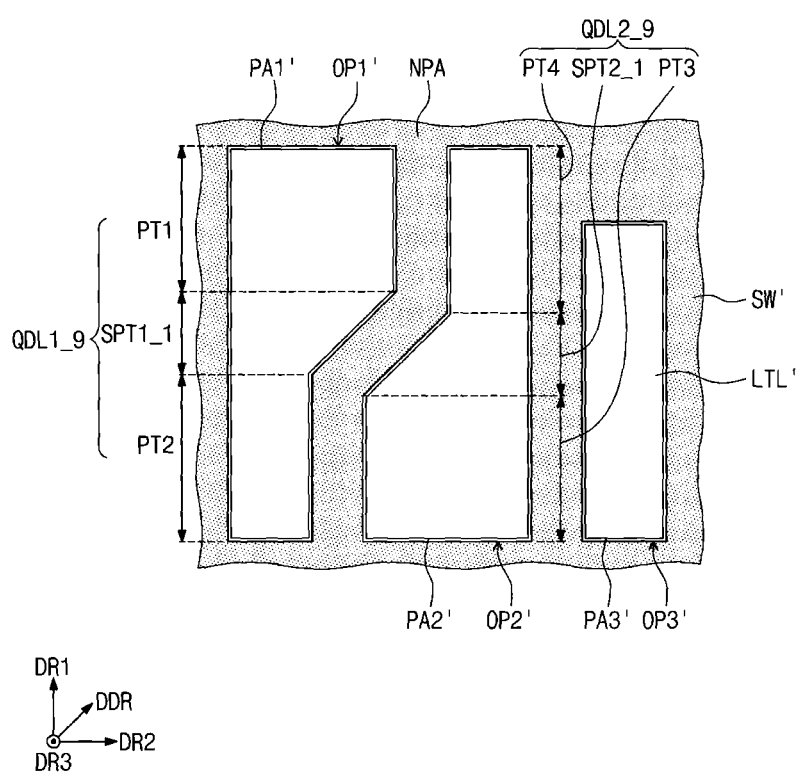

Referring to FIG. 27, configurations of the first quantum dot layer QDL1_7 and the second quantum dot layer QDL2_7 in a plan view may be substantially the same as the first quantum dot layer QDL1_3 and the second quantum dot layer QDL2_3, which are illustrated in FIG. 20. Hereinafter, since the light transmitting layer LTL' illustrated in FIGS. 27 to 29 is the same as the light transmitting layer LTL' illustrated in FIG. 25, a description thereof will be omitted. On the plan, the first emission area PA1' may have the substantially same shape as the first quantum dot layer QDL1_7, and the second emission area PA2' may have the substantially same shape as the second quantum dot layer QDL27.

A first opening OP1' for disposing the first quantum dot layer QDL1_7, a second opening OP2' for disposing the second quantum dot layer QDL27, and a third opening OP3' for disposing a light transmitting layer LTL may be formed in the barrier SW'. Like the barrier SW' described in FIG. 26, the first, second, and third openings OP1', OP2', and OP3' may be formed in the single barrier SW'.

Referring to FIG. 28, configurations of the first quantum dot layer QDL1_8 and the second quantum dot layer QDL2_8 in a plan view may be substantially the same as the first quantum dot layer QDL1_4 and the second quantum dot layer QDL2_4, which are illustrated in FIG. 21. The first emission area PA1' and the second emission area PA2' may have the substantially same shape as the first quantum dot layer QDL1_8 and the second quantum dot layer QDL2_8, respectively, in a plan view.

Like the barrier SW' described with reference to FIG. 26, a first opening OP1' for disposing the first quantum dot layer QDL1_8, a second opening OP2' for disposing the second quantum dot layer QDL2_8, and a third opening OP3' for disposing a light transmitting layer LTL may be formed in the single barrier SW'.

Referring to FIG. 29, configurations of the first quantum dot layer QDL1_9 and the second quantum dot layer QDL2_9 in a plan view may be substantially the same as the first quantum dot layer QDL1_5 and the second quantum dot layer QDL2_5, which are illustrated in FIG. 22. The first emission area PA1' and the second emission area PA2' may have the substantially same shape as the first quantum dot layer QDL1_9 and the second quantum dot layer QDL2_9, respectively, in a plan view.

Like the barrier SW' described with reference to FIG. 26, a first opening OP1' for disposing the first quantum dot layer QDL1_9, a second opening OP2' for disposing the second quantum dot layer QDL2_9, and a third opening OP3' for disposing a light transmitting layer LTL may be formed in the single barrier SW'.

It will be apparent to those skilled in the art that various modifications and variations can be made in the invention. Thus, it is intended that the invention covers the modifications and variations of this invention provided they come within the scope of the appended claims and their equivalents. Thus, to the maximum extent allowed by law, the scope of the invention is to be determined by the broadest permissible interpretation of the following claims and their equivalents, and shall not be restricted or limited by the foregoing detailed description.

Since the quantum dot layers used in manufacturing the display device have a specific shape, the light conversion efficiency may be improved, and the time for manufacturing the quantum dot layers may be reduced to manufacture the display device having the improved quality, and thus, the invention has high industrially applicability.

The invention claimed is:

1. A display device comprising:
   a display panel;
   a first quantum dot layer disposed on the display panel;
   a barrier layer having opening in which the first quantum dot layer is disposed; and
   a color filter and a black matrix disposed in a layer above the barrier layer, wherein
   the first quantum dot layer comprises:
      a first portion; and
      a second portion extending from a side of the first portion in a first direction,
   the second portion has a width less than a width of the first portion in a second direction intersecting the first direction, and
   the first portion overlaps the color filter, and the second portion overlaps the black matrix.

2. The display device of claim 1, wherein the first portion has a thickness greater than a thickness of the second portion in a third direction perpendicular to a plane defined by the first direction and the second direction.

3. The display device of claim 1, wherein the barrier layer comprises:
   a first barrier layer including a first opening, the first opening in which the first portion is disposed; and
   a second barrier layer disposed on the first barrier layer and including a second opening, the second opening in which the first portion and the second portion are disposed.

4. The display device of claim 3, wherein each of the first barrier layer and the second barrier layer has a black color.

5. The display device of claim 1, wherein
   the display panel comprises:
      a first emission area; and
      a non-emission area around the first emission area,
   the first emission area overlaps the first portion, and
   the second portion overlaps the non-emission area.

6. The display device of claim 5, wherein the first portion is configured to convert a first light generated in the first emission area into a second light.

7. The display device of claim 1, further comprising:
   a second quantum dot layer disposed on the display panel; and
   a light transmitting layer disposed on the display panel, wherein
   the first quantum dot layer, the second quantum dot layer, and the light transmitting layer are arranged in the second direction.

8. The display device of claim 7, wherein
the second quantum dot layer comprises:
- a third portion facing the second portion in the second direction; and
- a fourth portion extending from a side of the third portion in the first direction and facing the first portion in the second direction, and
the fourth portion has a width less than a width of the third portion in the second direction.

9. The display device of claim 8, wherein the third portion has a thickness greater than a thickness of the fourth portion in a third direction perpendicular to a plane defined by the first direction and the second direction.

10. The display device of claim 8, wherein
the display panel comprises:
- a second emission area; and
- a non-emission area around the second emission area,
the third portion overlaps the second emission area, and
the fourth portion overlaps the non-emission area.

11. The display device of claim 10, wherein the third portion is configured to convert a first light generated in the second emission area into a third light.

12. The display device of claim 7, wherein
the light transmitting layer comprises:
- a fifth portion extending in the first direction; and
- a sixth portion extending from a side of the fifth portion in the first direction, and
the fifth portion has a thickness greater than a thickness of the sixth portion in a third direction perpendicular to a plane defined by the first direction and the second direction.

13. The display device of claim 12, wherein
the display panel comprises:
- a third emission area; and
- a non-emission area around the third emission area,
the fifth portion overlaps the third emission area, and
the sixth portion overlaps the non-emission area.

14. The display device of claim 1, wherein
the first quantum dot layer further comprises a first sub portion disposed between the first portion and the second portion,
the first sub portion has a width less than the width of the first portion in the second direction, and
a thickness of the first sub portion is substantially equal to a thickness of the first portion in a third direction perpendicular to a plane defined by the first direction and the second direction.

15. The display device of claim 14, wherein
the width of the first sub portion is substantially equal to the width of the second portion, and
the first sub portion extends from the first portion in the second direction.

16. The display device of claim 14, wherein the width of the first sub portion gradually decreases as being closer to the second portion from the first portion in the second direction.

17. The display device of claim 14, further comprising:
- a first barrier layer including a first opening, the first portion and the first sub portion disposed in the first opening; and
- a second barrier layer disposed on the first barrier layer and including a second opening, the second opening in which the first portion, the second portion, and the first sub portion are disposed.

18. The display device of claim 1, further comprising a second quantum dot layer having a rectangular shape, facing the first portion in the first direction, and facing the second portion in the second direction.

19. A display device comprising:
- a display panel comprising an emission area and a non-emission area around the emission area;
- a first quantum dot layer disposed on the emission area;
- a barrier layer having opening in which a first quantum dot layer is disposed; and
- a color filter and a black matrix disposed in a layer above the barrier layer, wherein
the first quantum dot layer comprises:
- a first portion; and
- a second portion extending from a side of the first portion in a first direction,
the first portion has a thickness greater than a thickness of the second portion, and
the first portion overlaps the color filter, and the second portion overlaps the black matrix.

20. The display device of claim 19, wherein the barrier layer comprises:
- a first barrier layer including a first opening, the first opening in which the first portion is disposed; and
- a second barrier layer disposed under the first barrier layer and including a second opening, the second opening in which the first portion and the second portion are disposed.

21. An electronic device for providing an image, comprising:
a display device comprising:
- a display panel;
- a first quantum dot layer disposed on the display panel;
- a barrier layer having opening in which a first quantum dot layer is disposed; and
- a color filter and a black matrix disposed in a layer above the barrier layer, wherein
the first quantum dot layer comprises:
- a first portion; and
- a second portion extending from a side of the first portion in a first direction,
the second portion has a width less than a width of the first portion in a second direction intersecting the first direction, and
the first portion overlaps the color filter, and the second portion overlaps the black matrix.

* * * * *